United States Patent
Kanaya

(10) Patent No.: US 9,911,933 B2
(45) Date of Patent: Mar. 6, 2018

(54) DISPLAY DEVICE

(71) Applicant: Japan Display Inc., Tokyo (JP)

(72) Inventor: Heisuke Kanaya, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/391,224

(22) Filed: Dec. 27, 2016

(65) Prior Publication Data

US 2017/0237024 A1    Aug. 17, 2017

(30) Foreign Application Priority Data

Feb. 15, 2016  (JP) .................................. 2016-025924

(51) Int. Cl.
| | | |
|---|---|---|
| *H01L 51/00* | (2006.01) | |
| *H01L 51/52* | (2006.01) | |
| *H01L 27/32* | (2006.01) | |

(52) U.S. Cl.
CPC ...... *H01L 51/0097* (2013.01); *H01L 27/3276* (2013.01); *H01L 51/5253* (2013.01); *H01L 51/5293* (2013.01); *H01L 2251/5338* (2013.01); *H01L 2251/558* (2013.01)

(58) Field of Classification Search
CPC ............. H01L 51/0097; H01L 51/5253; H01L 27/3276; H01L 51/5293; H01L 2251/5338; H01L 2251/558
See application file for complete search history.

(56) References Cited

U.S. PATENT DOCUMENTS

| 9,291,842 B2 | 3/2016 | Yang et al. |
| 2009/0194771 A1 | 8/2009 | Koyama et al. |
| 2013/0169515 A1 | 7/2013 | Prushinskiy et al. |

FOREIGN PATENT DOCUMENTS

| JP | 2014-182306 A | 9/2014 |
| JP | 2015-72362 A | 4/2015 |

OTHER PUBLICATIONS

Taiwanese Office Action dated Oct. 23, 2017, for the corresponding Taiwanese patent application No. 105142965 with partial English translation.

*Primary Examiner* — Roy Potter
(74) *Attorney, Agent, or Firm* — Typha IP LLC

(57) ABSTRACT

Provided is a display device including: a base material; a plurality of light-emitting elements located over a first surface of the base material and having an emission region; and a first trench located over a second surface of the base and overlapping with a non-emission region sandwiched between the emission regions of two adjacent light-emitting elements selected from the plurality of light-emitting elements. Alternatively, the display device includes: a base material; a plurality of pixels located over a first surface of the base material and having a light-emitting element; a first trench located over a second surface of the base material and overlapping with a region sandwiched between two adjacent pixels selected from the plurality of pixels; and a ridge located over the first surface of the base material, overlapping with the first trench, and consisting of the base material.

20 Claims, 34 Drawing Sheets

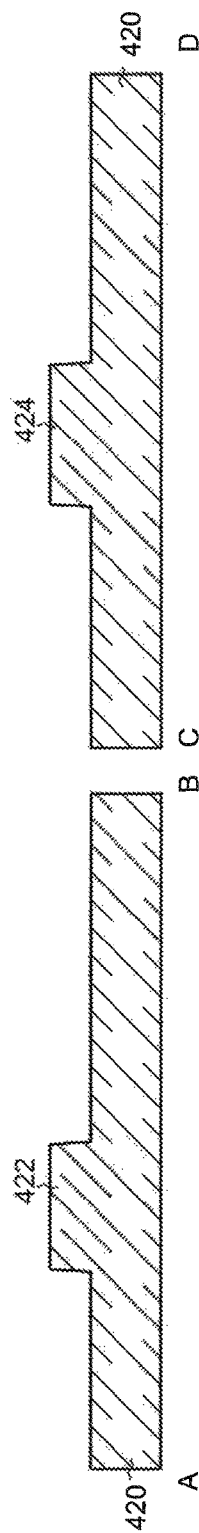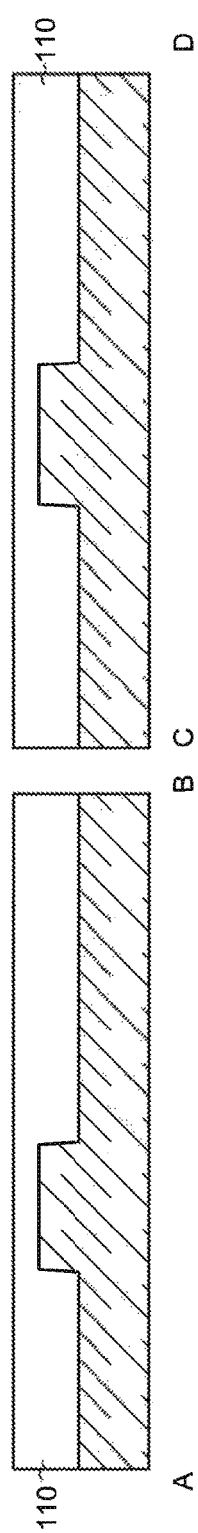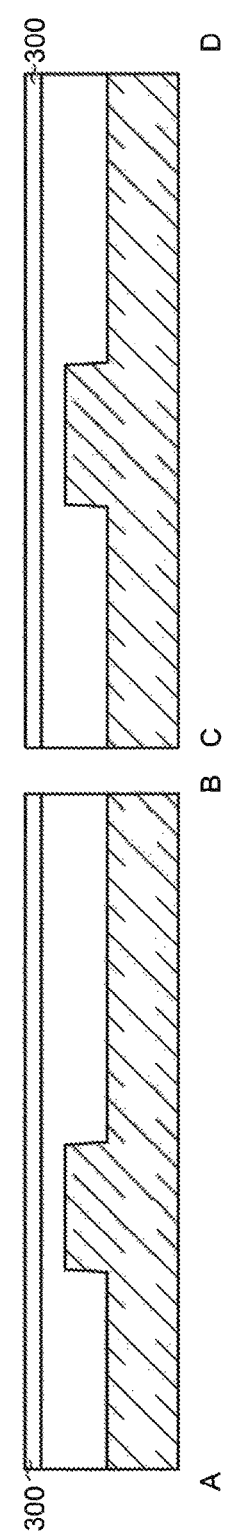

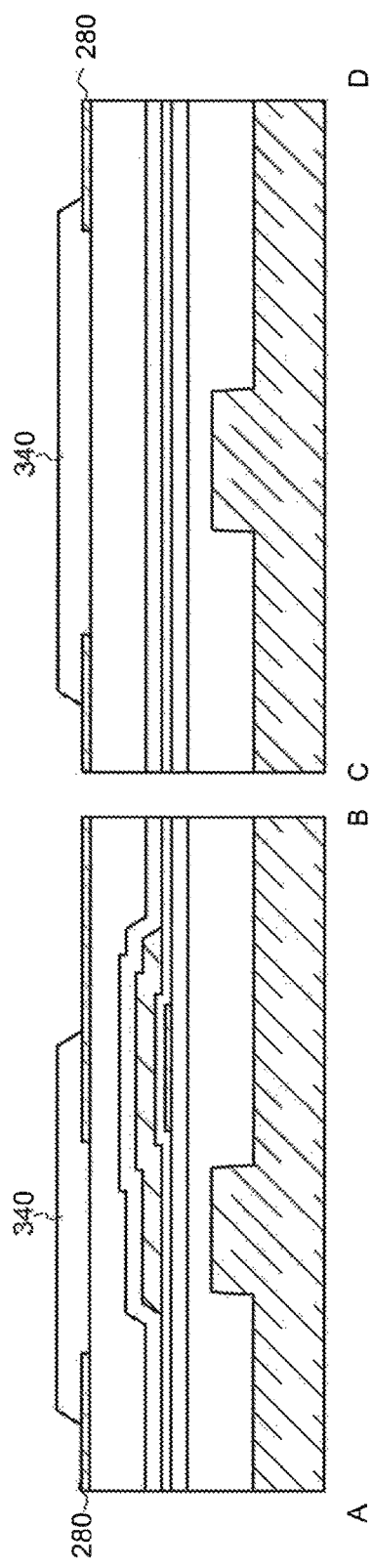
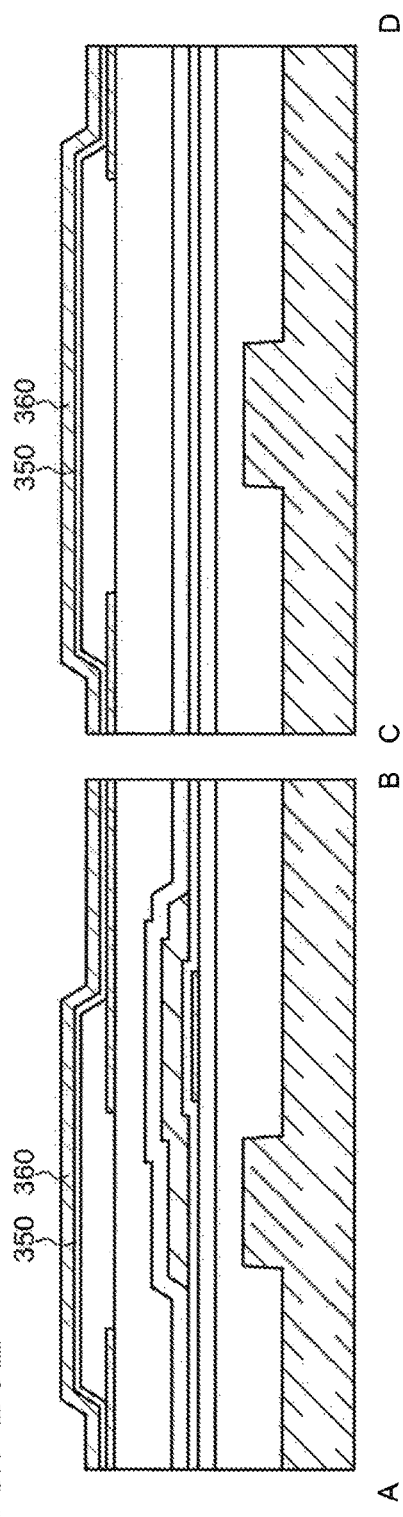
FIG. 10A
FIG. 10B

DISPLAY DEVICE

CROSS REFERENCE TO RELATED APPLICATIONS

This application is based on and claims the benefit of priority from the prior Japanese Patent Application No. 2016-025924, filed on Feb. 15, 2016, the entire contents of which are incorporated herein by reference.

FIELD

The present invention relates to a display device and a manufacturing method of the display device. For example, the present invention relates to a flexible EL display device and its manufacturing method.

BACKGROUND

As a typical example of a display device, a liquid crystal display device and an organic EL (electroluminescence) display device respectively having a liquid crystal element and a light-emitting element in each pixel are represented. These display devices have a liquid crystal element or an organic light-emitting element (hereinafter, referred to as a light-emitting element) in each of a plurality of pixels formed over a substrate. A liquid crystal element and a light-emitting element respectively possess a liquid crystal and a layer (hereinafter, referred to as an organic EL layer) including an organic compound between a pair of electrodes and are driven by applying a voltage or supplying a current to the pair of electrodes.

Apart from the case of a liquid crystal element, since a light-emitting element is formed as an all-solid display element, even if the substrates are provided with flexibility and folded or bent, variation of a gap between the substrates does not cause any influence. Therefore, display quality is not influenced in principle. Thus, a so-called flexible display (sheet display) in which a light-emitting element is formed over a flexible substrate has been fabricated. For example, a bendable flexible organic EL display device is disclosed in Japanese patent application publications No. 2015-72362 and 2014-182306.

SUMMARY

An embodiment of the present invention is a display device including: a base material; a plurality of light-emitting elements over a first surface of the base material, the plurality of light-emitting elements each having an emission region; and a first trench over a second surface of the base material, the first trench overlapping with a non-emission region sandwiched between the emission regions of two adjacent light-emitting elements selected from the plurality of light-emitting elements.

An embodiment of the present invention is a display device including: a base material; a plurality of pixels over a first surface of the base material, the plurality of pixels each having a light-emitting element; a first trench over a second surface of the base material, the first trench overlapping with a region sandwiched between two adjacent pixels selected from the plurality of pixels; and a ridge over the first surface of the base material, the ridge overlapping with the first trench and consisting of the base material.

An embodiment of the present invention is a manufacturing method of a display device, the manufacturing method including: forming a base material over a supporting substrate having a ridge; forming a plurality of pixels over a surface of the base material so that the ridge overlaps with a region sandwiched between the plurality of pixels; and separating the supporting substrate from the base material.

BRIEF DESCRIPTION OF DRAWINGS

FIG. 7A to FIG. 7C are schematic drawings for explaining a manufacturing method of a display device according to an embodiment;

FIG. 10A and FIG. 10B are schematic drawings for explaining a manufacturing method of a display device according to an embodiment;

DESCRIPTION OF EMBODIMENTS

Hereinafter, the embodiments of the present invention are explained with reference to the drawings. However, the invention can be implemented in a variety of different modes within its concept and should not be interpreted only within the disclosure of the embodiments exemplified below.

The drawings may be illustrated so that the width, thickness, shape, and the like are illustrated more schematically compared with those of the actual modes in order to provide a clearer explanation. However, they are only an example, and do not limit the interpretation of the invention. In the specification and the drawings, the same reference number is provided to an element that is the same as that which appears in preceding drawings, and a detailed explanation may be omitted as appropriate.

In the present invention, when a plurality of films is formed by processing one film, the plurality of films may have functions or rules different from each other. However, the plurality of films originates from a film which is formed as the same layer in the same process. Therefore, the plurality of films is defined as films existing in the same layer.

In the invention, unless specifically stated, when a state is expressed where a structure is arranged "over" another structure, such expression includes both a case where the substrate is arranged immediately above the "other structure" so as to be in contact with the "other structure" and a case where the structure is arranged over the "other structure" with an additional structure therebetween.

First Embodiment

In the present embodiment, a display device according to an embodiment of the present invention is explained by using FIG. 1 to FIG. 6.

Figure 1:
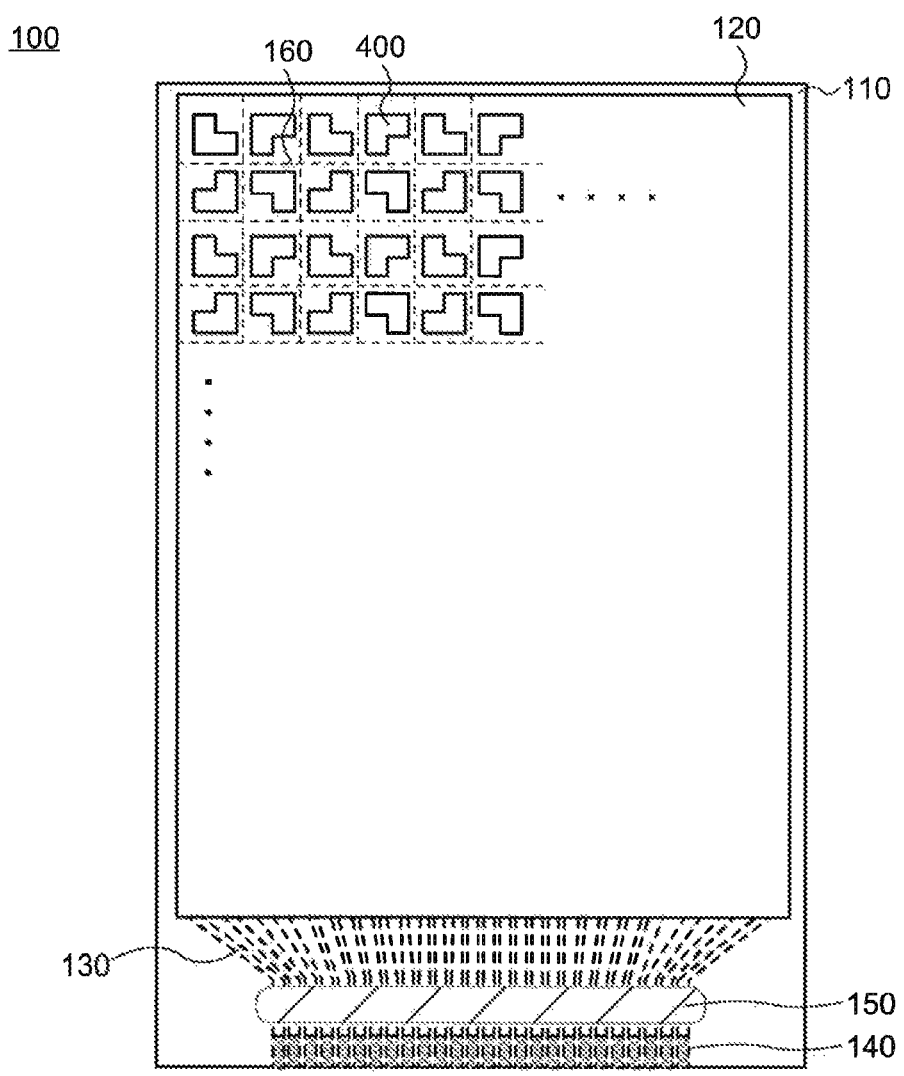
FIG. 1 is a schematic top view of a display device according to an embodiment.

A top view of the display device 100 according to the present embodiment is shown in FIG. 1. The display device 100 has a display region 120 including a plurality of pixels 160 over one surface (top surface) of a base material 110. An emission region 400 is defined in each of the plurality of pixels 160. Wirings 130 extend from the display region 120 to a side surface of the base material 110. The display region 120 is electrically connected to an IC chip 150 via the wirings 130. At an edge portion of the base material 110, terminals 140 are formed for electrically connecting an external circuit (not shown) to the IC chip 150 and the display region 120 via a connector (not shown). The plurality of pixels 160 are controlled with image signals supplied from the external circuit, and an image is reproduced on the display region 120. Note that flexibility can be provided to the whole of the display device 100 by using a film and the like having flexibility as the base material 110.

Although not shown, the display device 100 may possess a driver circuit instead of the IC chip 150 at a periphery of the display region 120. Alternatively, a driver circuit may be arranged at a periphery of the display region 120 together with the IC chip 150.

A light-emitting element is disposed in each of the pixels 160. Full color display can be performed by providing red-emissive, green-emissive, and blue-emissive light-emitting elements to the respective pixels 160. Alternatively, full color display may be carried out by using white-emissive light-emitting elements in all of the pixels 160 and extracting red, green, and blue colors from the respective pixels 160 by using a color filter. The colors finally extracted are not limited to a combination of red, green, and blue colors, and four kinds of color of red, green, blue, and white may be extracted from the pixels 160. There is also no limitation to the arrangement of the pixels 160, and a stripe arrangement, a Pentile arrangement, a mosaic arrangement, and the like may be employed.

Figure 2A:
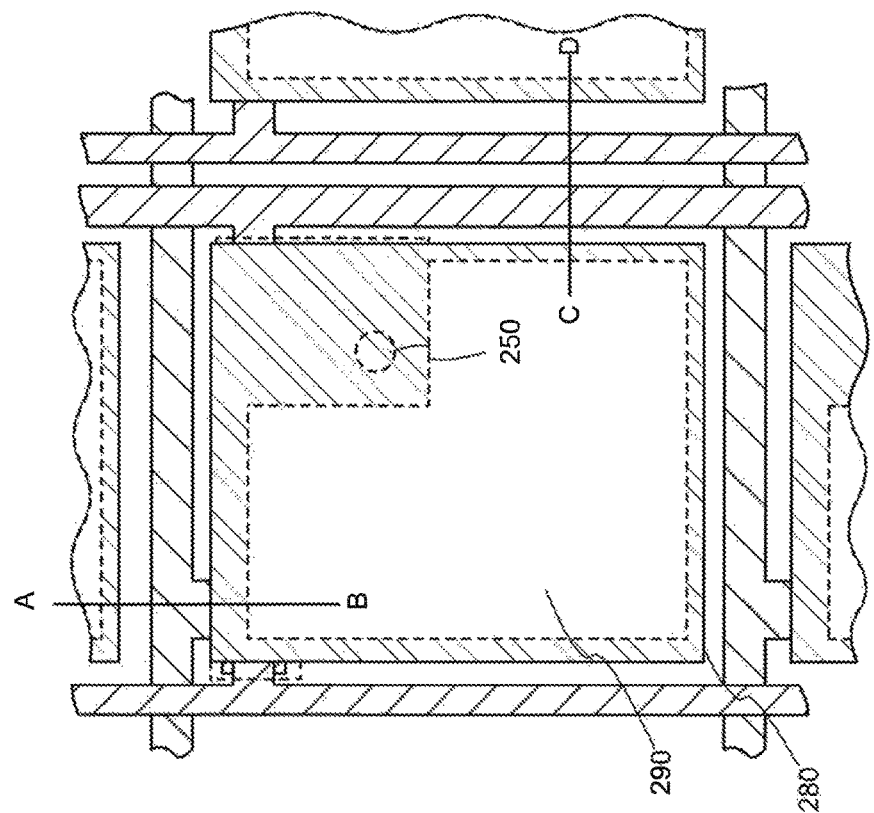
FIG. 2A and FIG. 2B are schematic top views of a display device according to an embodiment.
Figure 2B:
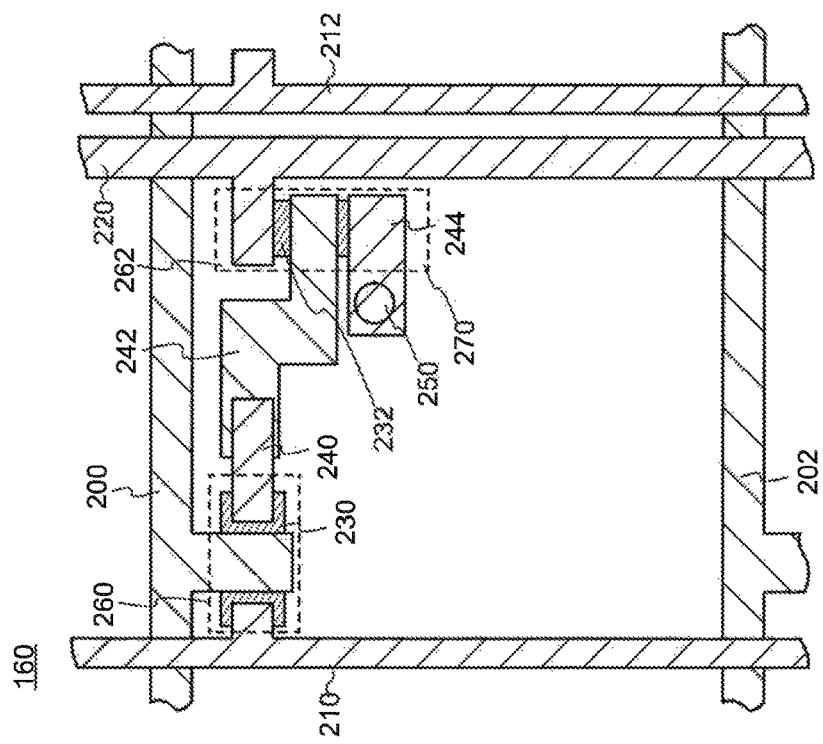

Enlarged figures of the pixel 160 are shown in FIG. 2A and FIG. 2B. Note that FIG. 2A corresponds to a drawing obtained by omitting a first electrode 280 from FIG. 2B. As shown in FIG. 2A, wirings such as gate lines 200 and 202, signal lines 210 and 212, and a current-supplying line 220 are formed over the base material 110. A region demarcated by the gate lines 200 and 202, the signal line 212, and the current-supplying line 220 is one pixel 160. The gate line 202 and the signal line 212 control the pixel 160 adjacent to the pixel 160 illustrated in FIG. 2A. Note that a part of these wirings may be shared by two or more adjacent pixels 160. For example, the current-supplying line 220 may be shared by both of two adjacent pixels 160.

The pixel 160 illustrated in FIG. 2A and FIG. 2B has two transistors 260 and 270. The gate line 200 has a function to transmit a gate signal to the transistor 260, and a part of the gate line 200 (a portion protruding downward in the drawing) serves as a gate electrode of the transistor 260. The signal line 210 has a function to transmit an image signal to the transistor 260, and a part of the signal line 210 (a portion protruding rightward in the drawing) serves as a source electrode of the transistor 260. The image signal transmitted by the signal line 210 is transmitted, via a semiconductor film 230, to a wiring 240 functioning as a drain electrode of the transistor 260. The image signal is further transmitted to the transistor 270 via a wiring 242. That is, a part of the wiring 242 serves as a gate electrode of the transistor 270 and controls the on/off of the transistor 270. The transistor 270 includes a part of the current-supplying line 220 (a portion protruding leftward in the drawing) as a source electrode. Current supplied by the current-supplying line 220 is transported to a wiring 244 functioning as a drain electrode via a semiconductor film 232. With respect to the aforementioned transistors 260 and 270, the definition of the source and drain may be reversed depending on the potentials of the signal line 210, the wiring 240, the current-supplying line 220, and the wiring 244.

The wiring 244 is electrically connected to the first electrode 280 through a contact hole 250, and current supplied by the current-supplying line 220 is supplied to the first electrode 280. An insulating film (described below) serving as a partition wall 340 is formed over the first electrode 280, and the first electrode 280 contacts with an organic EL layer 350 (described below) in opening portion 290 thereof. The first electrodes 280 of the adjacent upper, lower, and right pixels 160 with respect to the pixel 160 are partly illustrated in FIG. 2B.

In FIG. 2B, the first electrode 280 is almost square, and the opening portion 290 is illustrated in a hook shape. However, the shapes of the first electrode 280 and the opening portion 290 are not limited. The first electrode 280 and the opening portion 290 may be a polygonal shape such as a square shape, a diamond shape, and a rectangular shape and may also be a circular shape. When the opening portion 290 is polygonal, its corner may be curved. Here, the pixel 160 possesses two transistors 260 and 270. However, there is no limitation to the number of the transistors, and three or more transistors may be included. Furthermore, the pixel 160 may have a wiring for forming a capacitor in addition to the transistors.

Figure 3:
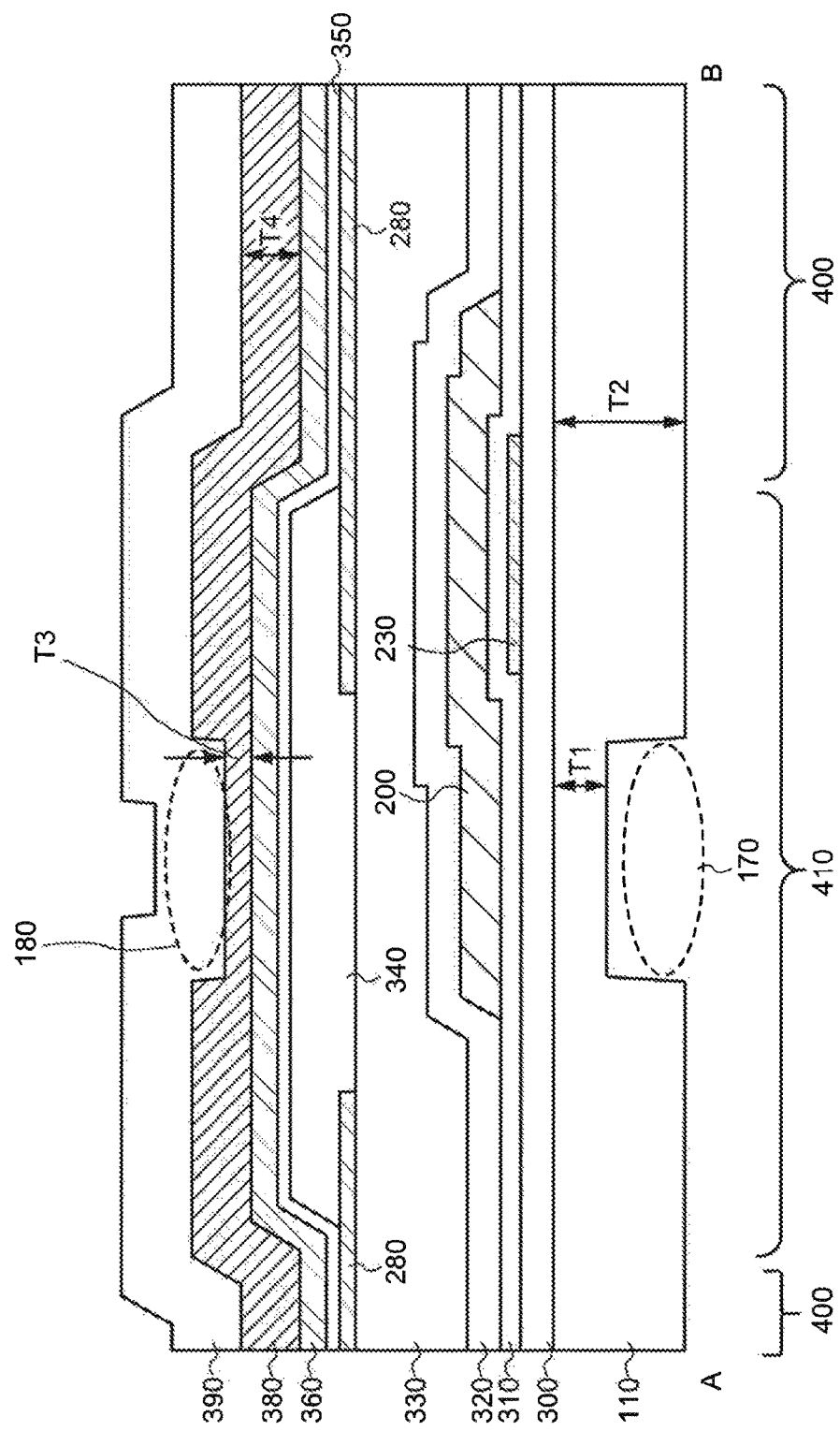
FIG. 3 is a schematic cross-sectional view of a display device according to an embodiment.
Figure 4:
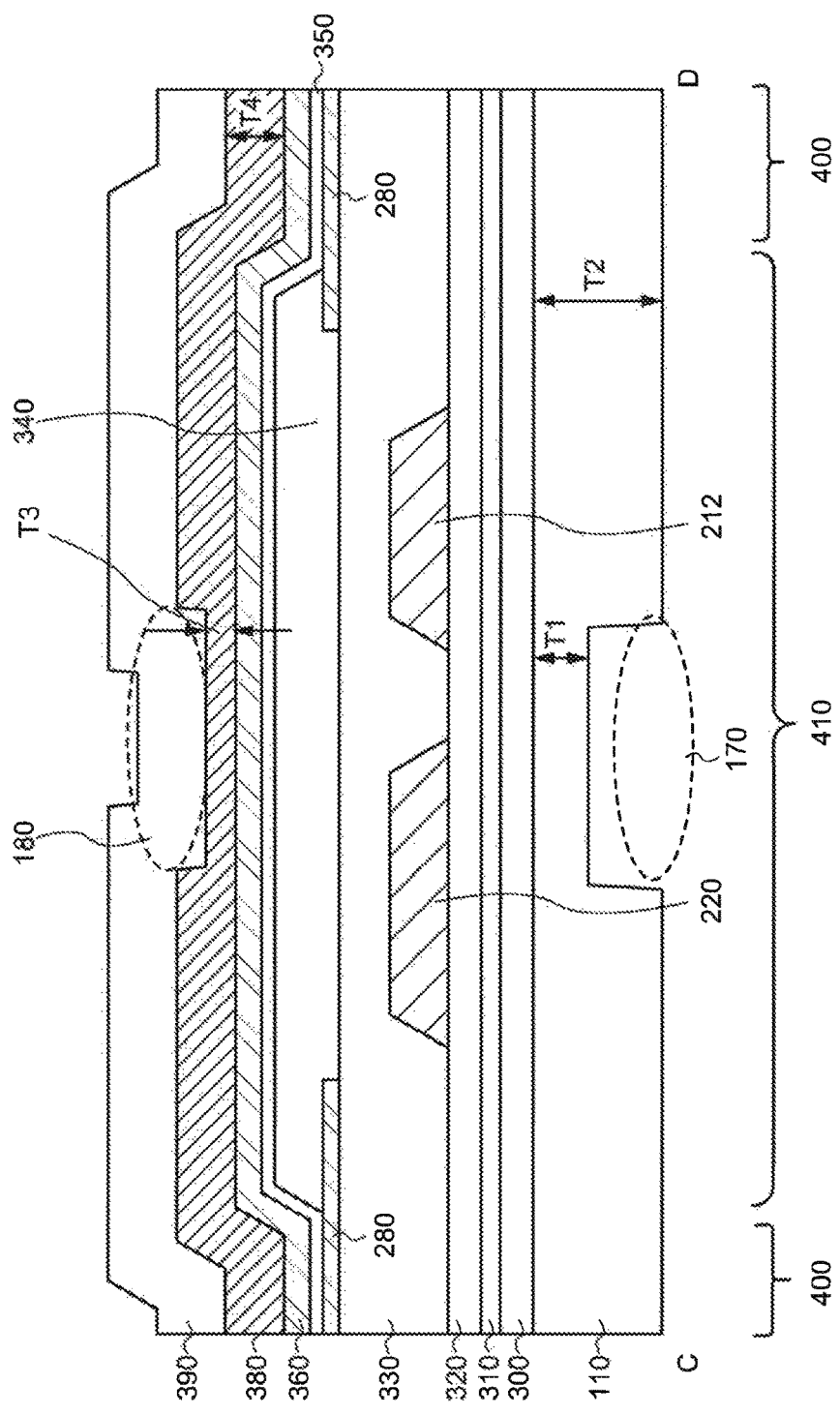
FIG. 4 is a schematic cross-sectional view of a display device according to an embodiment.

Schematic views of the cross sections along straight lines A-B and C-D of FIG. 2B are shown in FIG. 3 and FIG. 4, respectively. As shown in FIG. 3, the pixel 160 has the semiconductor 230 over the base material 110 with a base film 300 interposed therebetween. A gate insulating film 310, the gate line 200, and an interlayer insulating film 320 are provided over the semiconductor film 230. A leveling film 330 is disposed over the interlayer insulating film 320 in order to absorb depressions and projections caused by the semiconductor film 230 and the gate line 200, which are structural elements of the transistor 260, and to give a flat surface. The first electrodes 280 of the pixel 160 and its adjacent pixels 160 are formed over the leveling film 330. The pixel 160 further includes the partition wall 340 covering an edge portion of the first electrode 280, by which the first electrodes 280 of the adjacent pixels 160 are electrically insulated.

The organic EL layer 350 including an organic compound is disposed over the first electrode 280 and the partition wall 340, over which a second electrode 360 is formed. The organic EL layer 350 and the first electrode 280 are in physical contact with each other in the opening portion 290 of the partition wall 340, and the light-emitting element is structured with the first electrode 280, the organic EL layer 350, and the second electrode 360. Light emission from the organic EL layer 350 can be obtained in a region in which the organic EL layer 350 and the first electrode 280 are in contact with each other, and this region is the emission region 400 of the light-emitting element. Therefore, the shape of the emission region 400 is the same as that of the opening portion 290 of the partition wall 340. A region sandwiched by the emission regions 400 of two pixels 160 adjacent to each other is a non-emission region 410. A sealing film 380 is provided over the second electrode 360. As described below, this sealing film 380 may contain at least one layer and may have a three-layer structure. As an optional structure, a polarizing plate 390 and the like are arranged over the sealing film 380, for example. Although not shown here, a color filter, a light-shielding film, an overcoat film formed thereover, and the like may be provided over the sealing film 380.

Figure 5:
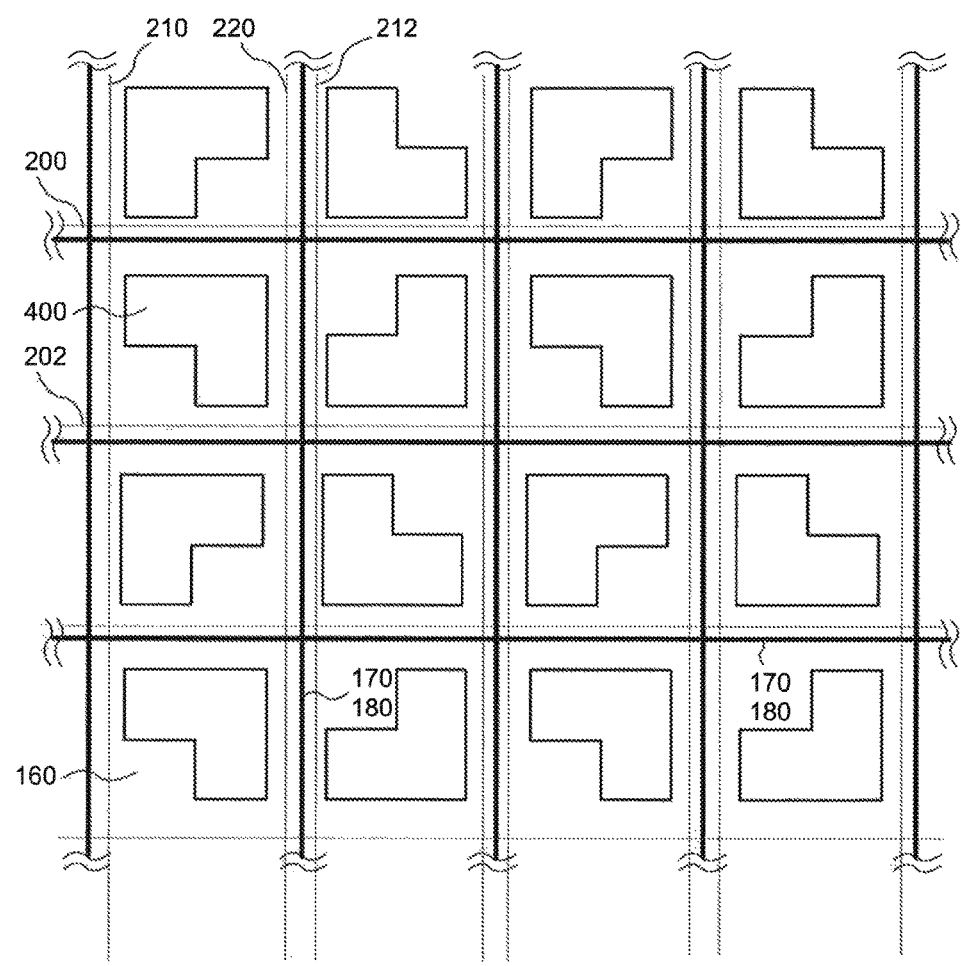
FIG. 5 is a schematic top view of a display device according to an embodiment.
Figure 6:
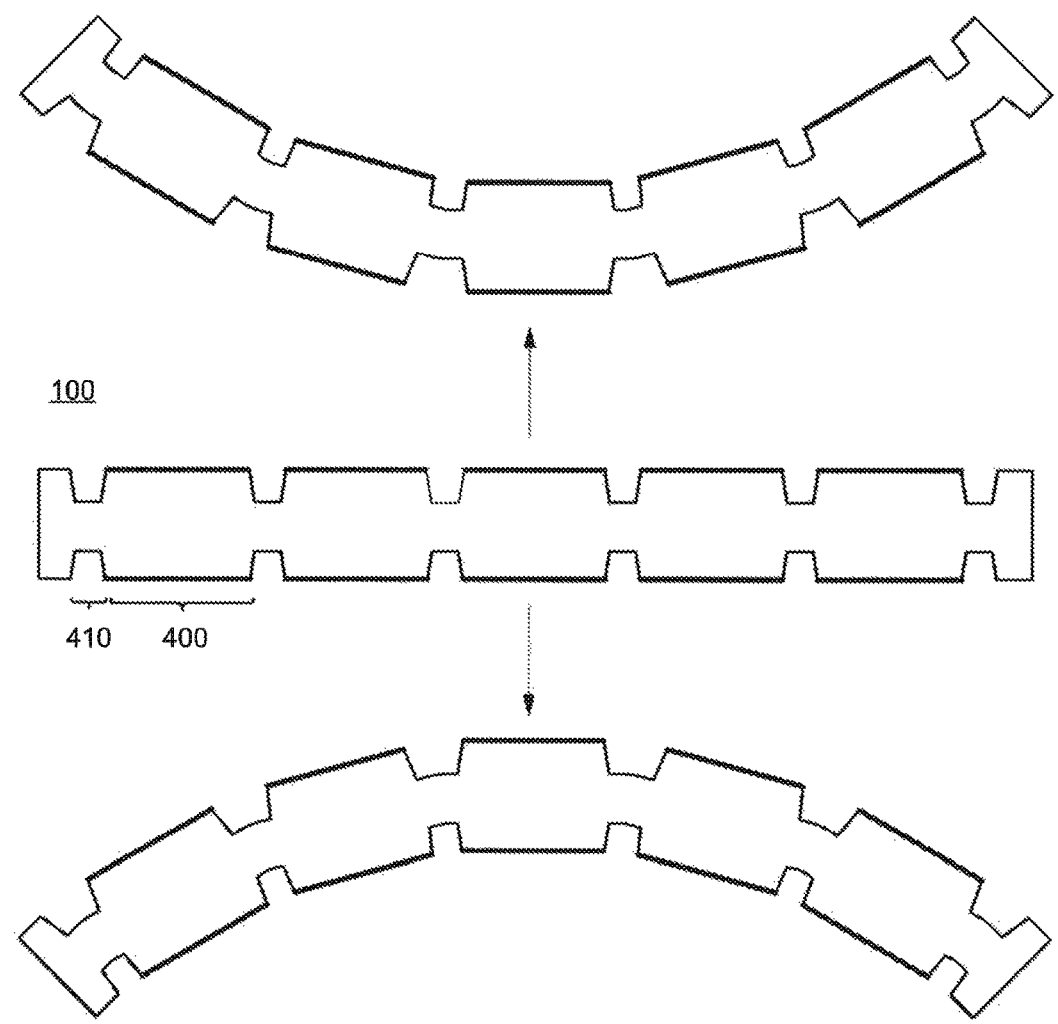
FIG. 6 is schematic cross-sectional views of a display device according to an embodiment.

Here, in the non-emission region 410, that is, in the region sandwiched by two adjacent pixels 160, a trench (first trench) 170 is formed over another surface (bottom surface) of the base material 110. A thickness T1 of the base material 100 in this trench 170 is smaller than a thickness T2 of the base material 110 under the emission region 400. FIG. 5 schematically shows a positional relationship between the first trench 170 and the pixel 160. The first trench 170 extends along the gate line 200.

Similarly, as shown in FIG. 3, a trench (second trench) 180 is formed in the sealing film 380 formed over the second electrode 360. A thickness T3 of the sealing film 380 in this second trench 180 is smaller than a thickness T4 of the sealing film 380 over the emission region 400. As shown in FIG. 5, the second trench 180 also extends along the gate line 200.

Referring to the cross section in FIG. 4, the gate insulating film 310 and the interlayer insulating film 320, which structure the transistors 260 and 270, are formed over the base material 110 with the base film 300 interposed therebetween. The current-supplying line 220 and the signal line 212 of the adjacent pixel 160 are disposed over the interlayer insulating film 320. The leveling film 330 formed over the transistors 260 and 270 is formed over these wirings. Similar to the case of FIG. 3, the first electrodes 280 of the pixel 160 and the pixel 160 adjacent thereto, the partition wall 340, the organic EL layer 350, the second electrode 360, and the sealing film 380 are formed over the leveling film 330. Furthermore, the polarizing plate 390 and the like are arranged as an optional structure. Similar to the case of FIG. 3, a color filter, a light-shielding film, or an overcoat film formed thereover may be provided over the sealing film 380.

Similar to the cross-sectional structure of FIG. 3, the trench (first trench) 170 is formed at the bottom surface of the base material 110 shown in FIG. 4. The thickness T1 of the base material 110 in this first trench 170 is smaller than the thickness T2 of the base material 110 under the emission region 400. Moreover, as shown in FIG. 5, the first trench 170 extends along the signal line 210 and the current-supplying line 220.

As shown in FIG. 4, the trench (second trench) 180 is also formed in the sealing film 380 formed over the second electrode 360. The thickness T3 of the sealing film 380 in this second trench 180 is smaller than the thickness T4 of the sealing film 380 over the emission region 400. As shown in FIG. 5, the second trench 180 also extends along the signal line 210 and the current-supplying line 220. Note that a part of the first trench 170 and a part of the second trench 180 may not overlap with each other. Additionally, the first trench 170 and the second trench 180 may overlap with the gate line 200, the signal line 210, and the current-supplying line 220, and a part of the first trench 170 and a part of the second trench 180 may not overlap with these wirings.

As described above, the use of a film having flexibility as the base material 110 allows the display device 100 to possess flexibility. In the aforementioned structure, the non-emission region 410 has a region in which the thicknesses of the base material 110 and the sealing film 380 are partly small, and the thicknesses T1 and T3 of the base material 110 and the sealing film 380 in this region are smaller than the thicknesses T2 and T4 of the emission region 400, respectively. Hence, as schematically demonstrated in FIG. 6, when the display device 100 is deformed by folding or bending, the non-emission region 410 is deformed more largely than the emission region 400. In other words, the emission region 400 is not deformed or its deformation is minimized while selectively deforming the non-emission region 410, by which the display device 100 can be deformed as a whole.

When a flexible display is deformed, the films constructing the display device are different in hardness and thickness from one another. Therefore, pealing readily occurs at an interface between the films having a large difference in hardness. For example, the base material 110 and the sealing film 380 have a large film thickness and hardness compared with other films. Hence, the base material 110 and the sealing film 380 are readily pealed when deformed. When the interface pealing occurs in the emission region 400 or at its vicinity, damage of the light-emitting element is immediately recognized, leading to a display defect.

In contrast, like the structure of the present embodiment, the trenches 170 and 180 are formed in a part of the base material 110 and the sealing film 380, and the non-emission region 410 is selectively deformed, thereby avoiding large stress to be placed on the emission region 400. Accordingly, a flexible display with high reliability in which a display defect hardly occurs can be supplied.

Second Embodiment

In the present embodiment, an example of a manufacturing method of the display device 100 explained in the First Embodiment is explained by using FIG. 7A to FIG. 12. In each drawing, the cross sections along straight lines A-B and C-D of FIG. 2B are illustrated.

First, a supporting substrate 420 in which ridges 422 and 424 are formed is prepared (FIG. 7A). Glass, quartz, ceramics, a metal, and the like can be used for the supporting substrate 420. The ridges 422 and 424 may be formed by etching a flat substrate or forming a structural member of an insulator and the like on a flat substrate.

Next, the base material 110 is formed over the supporting substrate 420 (FIG. 7B). A material having flexibility may be used for the base material 110, and a polymer material such as a polyimide, a polyamide, a polyester, and an epoxy resin or a precursor thereof can be used. Minute particles or fiber of glass may be mixed in these materials. The base material 110 can be formed with a spin-coating method, an ink-jet method, a printing method, a dip-coating method, and the like. Alternatively, the base material 110 may be formed by placing a polymer sheet on the supporting substrate 420 and applying pressure thereon. In FIG. 7A and FIG. 7B, the base material 110 is disposed so as to absorb depressions and projections caused by the ridge 422 and 424 and give a flat surface. A thickness of the base material 110 is equal to or larger than 3 µm and equal to or smaller than 100 µm, preferably equal to or larger than 5 µm and equal to or smaller than 50 µm, or more preferably equal to or larger than 10 µm and equal to or smaller than 20 µm.

After that, the base film 300 is formed over the base material 110 (FIG. 7C). The base film 300 has a function to prevent diffusion of impurities from the base material 110 and the supporting substrate 420, includes, for example, an inorganic compound such as silicon oxide, silicon nitride oxide, silicon oxynitride, and silicon nitride, and is formed with a chemical vapor deposition (CVD) method and the like. In FIG. 7C, the base film 300 is illustrated so as to have a single-layer structure. However, the base film 300 may have a structure in which a plurality of layers of an inorganic compound is stacked.

Figure 8A:
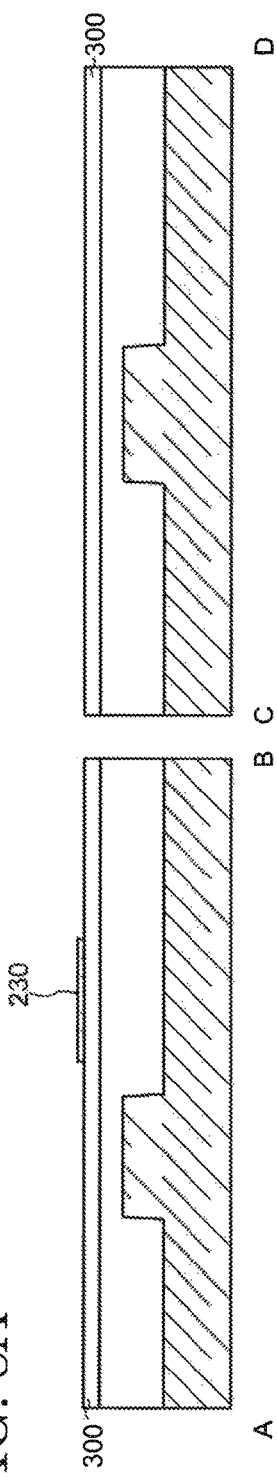
FIG. 8A to FIG. 8C are schematic drawings for explaining a manufacturing method of a display device according to an embodiment.
Figure 8B:
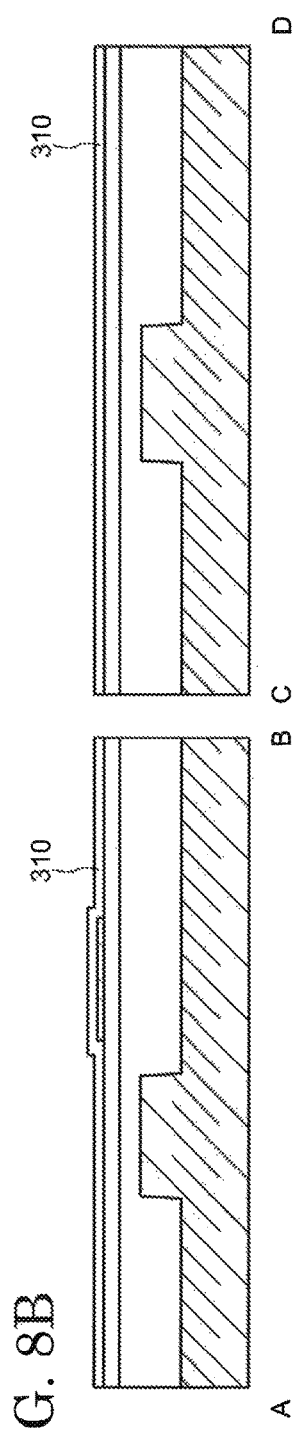

Next, as shown in FIG. 8A, the semiconductor film 230 (and the semiconductor film 232) is formed over the base film 300. The semiconductor film 230 may contain silicon or an oxide semiconductor and can be formed with a CVD method or sputtering method. Crystallinity thereof can be freely selected and may be amorphous, microcrystalline, polycrystalline, or single crystalline. The gate insulating film 310 with a single-layer or stacked-layer structure is formed over the semiconductor film 230 (and the semiconductor film 232) (FIG. 8B). The gate insulating film 310 can be formed by appropriately combining the materials used in the base film 300.

Figure 8C:
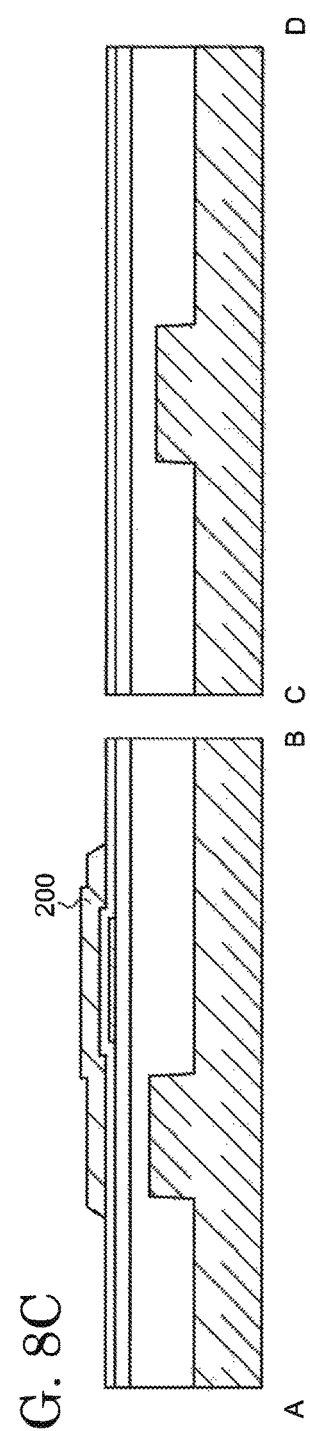

Next, as shown in FIG. 8C, the gate line 200 is formed over the gate insulating film 310. The gate line 200 can be formed with a metal such as aluminum, copper, titanium, molybdenum, tantalum, and tungsten so as to have a single-layer or stacked-layer structure. For example, the gate line 200 may be formed by stacking a metal with high conductivity, such as aluminum and copper, and a metal with high blocking ability, such as titanium and molybdenum. As a formation method of the gate line 200, a CVD method, a sputtering method, and the like are represented. A region of the gate line 200, which overlaps with the semiconductor film 230, functions as the gate electrode of the transistor 260. Although not shown, the wiring 242 and the like which exist in the same layer as the gate line 200 are simultaneously formed.

Figure 9A:
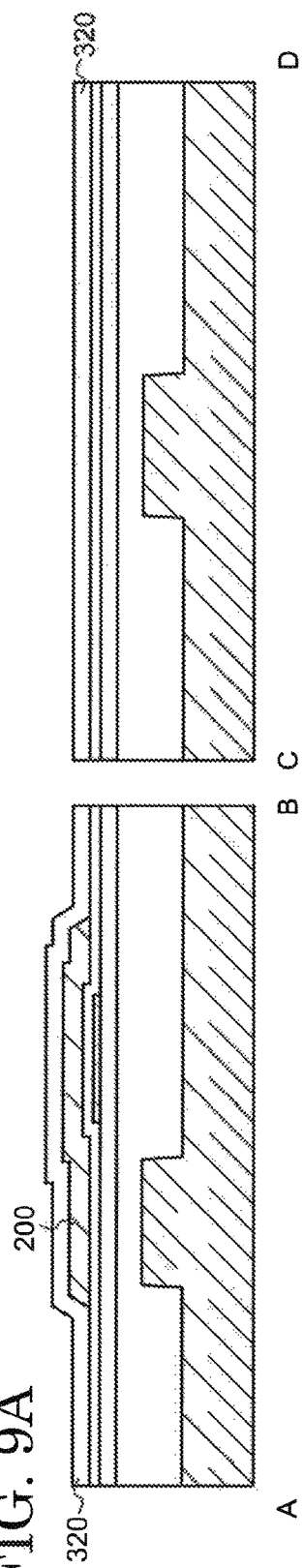
FIG. 9A to FIG. 9C are schematic drawings for explaining a manufacturing method of a display device according to an embodiment.

Next, the interlayer insulating film 320 is formed over the gate line 200 (FIG. 9A). The interlayer insulating film 320 can be formed by appropriately combining the materials used in the base film 300 and the gate insulating film 310 so as to have a single-layer or stacked-layer structure. Note that, although not shown, the wirings such as the signal lines 210 and 212 and the current supplying line 220 are formed after the formation of the interlayer insulating film 320. The wirings such as the gate line 200, the signal lines 210 and 212, and the current-supplying line 220 are formed along the ridges 422 and 424. These wirings may overlap with the ridges 422 and 424 partly or wholly.

Figure 9B:
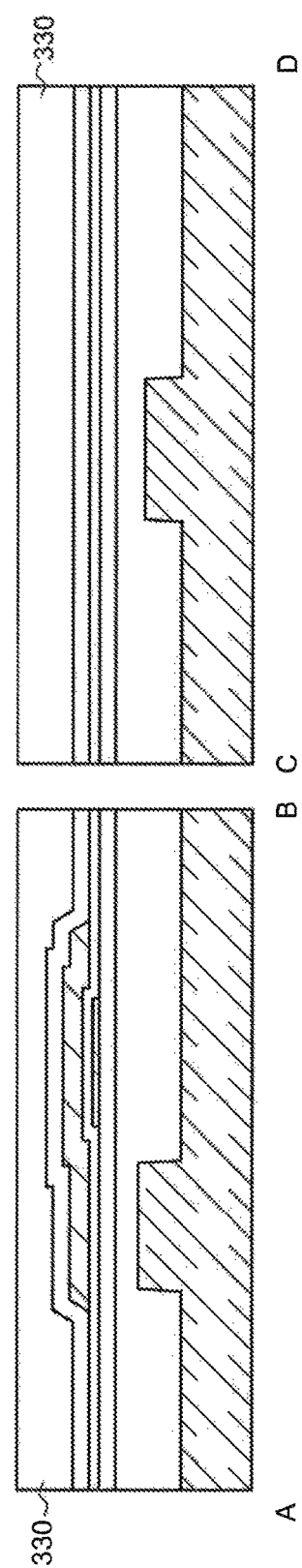

Through these steps, although projections and depressions are formed over the supporting substrate 420, the formation of the leveling film 330 over the interlayer insulating film 320 enables it to absorb these projections and depressions, giving a flat surface (FIG. 9B). The leveling film 330 can be formed with a spin-coating method, a dip-coating method, a printing method, and the like by using a polymer material such as an epoxy resin, a polyimide, and a polysiloxane. Although not shown, a protection film prepared with, for example, an inorganic insulating film may be further formed over the leveling film 330.

Figure 9C:
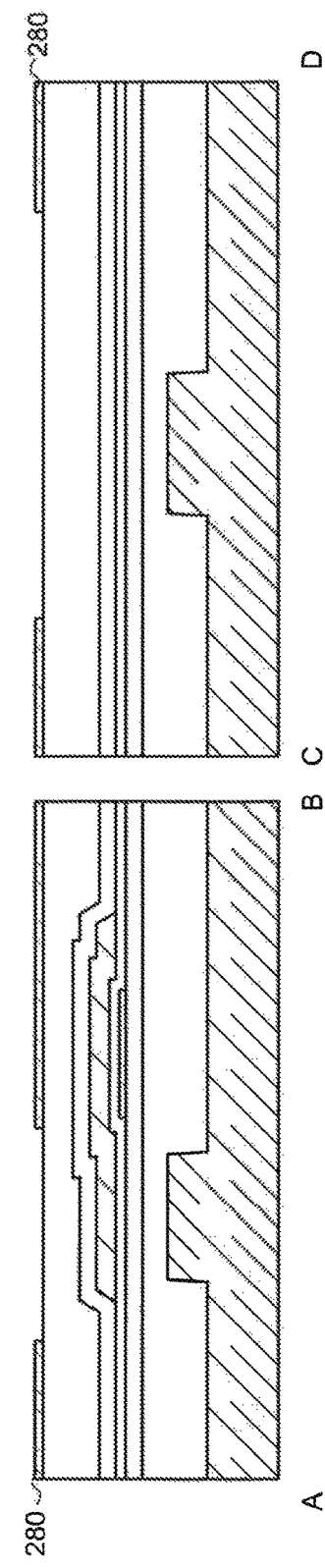

Next, the first electrode 280 of the light-emitting element is formed over the leveling film 330 (FIG. 9C). A metal which reflects visible light and a conductive oxide which transmits visible light and the like can be used for the first electrode 280. When light emission from the light-emitting element is extracted from a side of the base material 110, the first electrode 280 may be formed, for example, with a conductive oxide having a light-transmitting property, such as indium-tin oxide (ITO) and indium-zinc oxide (IZO), by applying a sputtering method, a sol-gel method, and the like. On the other hand, when the light-emission from the light-emitting element is extracted from a side opposite to the base material 110, a metal with high reflectance, such as aluminum and silver, may be used for the first electrode 280, for example. In this case, a conductive oxide may be stacked over these metals.

Next, the partition wall 340 is formed by forming an insulating film to cover the edge portion of the first electrode 280 (FIG. 10A). The partition wall 340 has a function not only to prevent a short circuit between the first electrode 280 and the second electrode 360 by covering the edge portion of the first electrode 280 but also to separate the adjacent pixels 160 from each other. A polymer material such as a polyimide, a polyamide, an epoxy resin, and a polysiloxane can be used for the partition wall 340, for example.

After forming the partition wall 340, the organic EL layer 350 and the second electrode 360 are formed (FIG. 10B). The organic EL layer 350 undergoes recombination of the charges injected from the first electrode 280 and the second electrode 360 and is formed by combining a variety of functional layers. For example, the organic EL layer 350 is formed by combining a hole-injection layer, a hole-transporting layer, an emission layer, an electron-transporting layer, an electron-injection layer, a hole-blocking layer, an electron-blocking layer, and the like. An evaporation method, an ink-jet method, a spin-coating method, and the like can be applied as a film-formation method. The material which is the same as that of the first electrode 280 can be used for the second electrode 360. When the light emission from the organic EL layer 350 is extracted from the first electrode 280 side, it is preferred to use a material having high reflectance with respect to visible light for the second electrode 360, and silver, aluminum, and the like can be used, for example. Application of an evaporation method, a sputtering method, or the like to these materials allows the formation of the second electrode 360. On the contrary, when light is extracted from the second electrode 360 side, a conductive oxide such as ITO and IZO can be used. Alternatively, the second electrode 360 can be prepared with magnesium, silver, or an alloy thereof at a thickness (several nanometers to several tens nanometers) which allows visible light to pass therethrough. The second electrode 360 may be formed by stacking a conductive oxide over these metals and alloys.

Figure 11A:
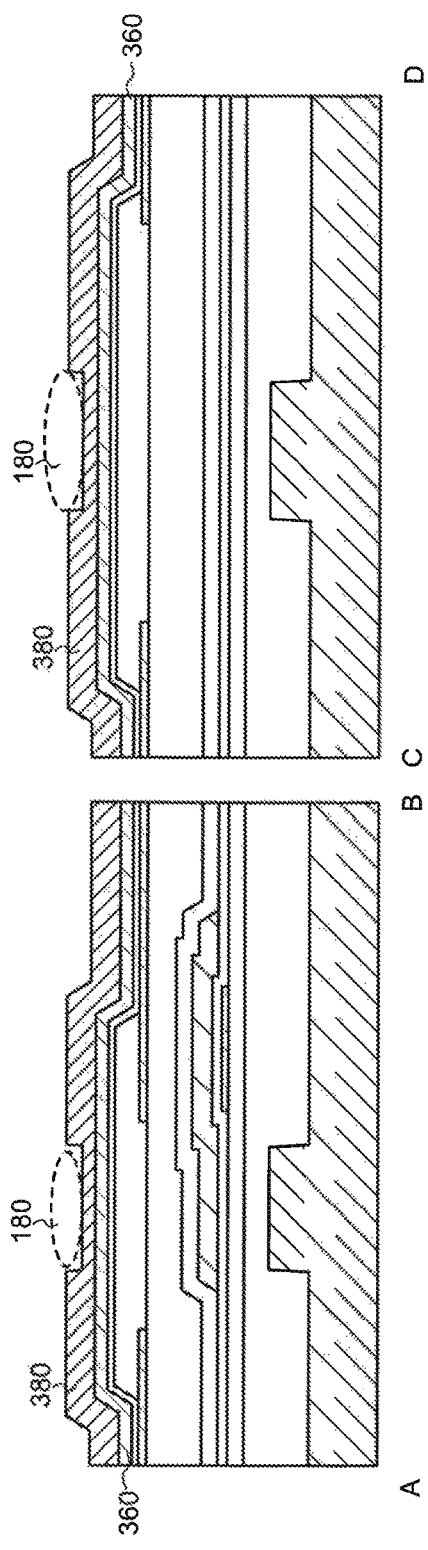
FIG. 11A and FIG. 11B are schematic drawings for explaining a manufacturing method of a display device according to an embodiment.

Next, the sealing film 380 is formed over the second electrode 360 (FIG. 11A). This sealing film 380 has a function to prevent the entrance of impurities such as water and oxygen to the light-emitting element from outside. The second trench 180 is formed in the sealing film 380. The formation of the second trench 180 partly reduces the thickness of the sealing film 380 in the non-emission region 410. The second trench 180 may be formed along the wirings such as the gate line 200, the signal lines 210 and 212, and the current-supplying line 220. The second trench 180 may be formed so as to overlap a part or all of these wirings.

Here, the sealing film 380 has a function to prevent the entrance of impurities such as oxygen and water into the light-emitting element, and an inorganic insulating film consisting of an inorganic compound such as silicon oxide, silicon nitride, silicon oxynitride, and silicon nitride oxide can be used, for example. Alternatively, an organic insulating film consisting of an organic compound such as an acrylic resin may be employed. These materials may be stacked. For example, a film having a structure in which an organic insulating film consisting of an acrylic resin is sandwiched by a silicon-nitride film or a silicon-oxide film can be used as the sealing film 380. In this case, the second trench 180 can be formed by forming a trench in one or more of these layers. The aforementioned inorganic insulating film and organic insulating film can be formed by appropriately combining a physical vapor deposition such as a sputtering method and an evaporation method, a CVD method, a liquid-phase method such as a spin-coating method, an ink-jet method, and a printing method, a lamination method, or the like. The second trench 180 may be formed by etching, a nanoimprinting method, or the like.

Figure 33A:
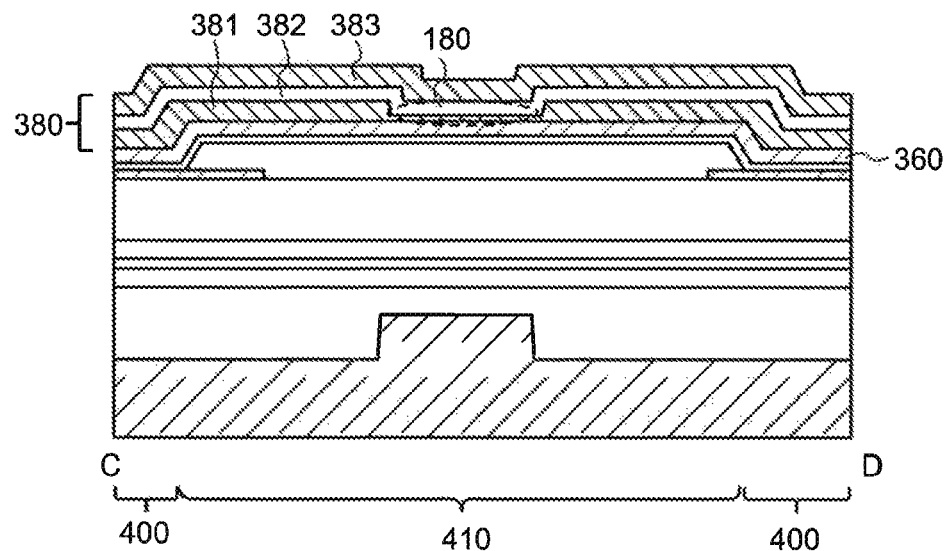
FIG. 33A and FIG. 33B are schematic cross-sectional views of a display device according to an embodiment.
Figure 33B:
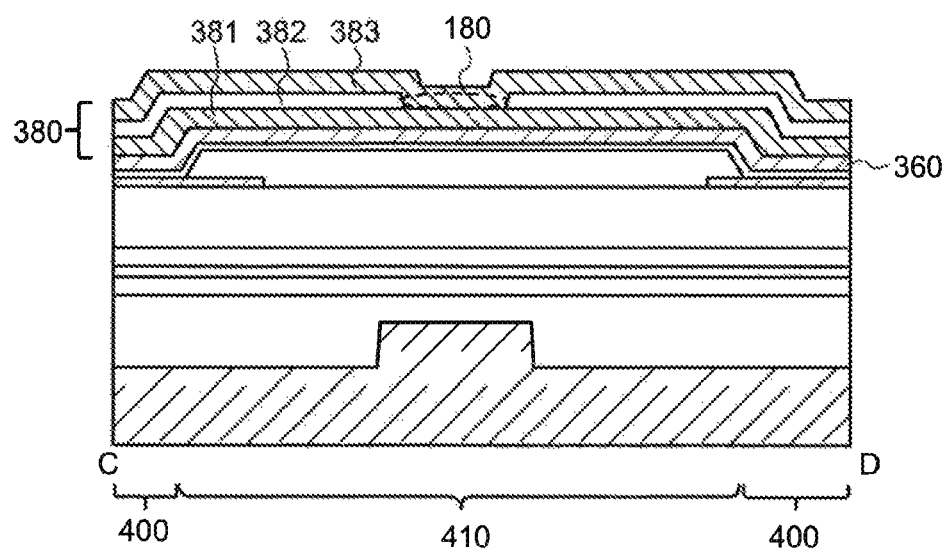

An example of the aforementioned three-layer structure is shown in FIG. 33A and FIG. 33B. In FIG. 33A and FIG. 33B, the sealing film 380 consists of inorganic insulating films 381 and 383 and an organic insulating film 382 sandwiched between these two films. In FIG. 33A, the second trench 180 is formed in the inorganic insulating film 381, and the organic insulating film 382 and the inorganic film 383 reflect the shape of the second trench 180. In this case, a thickness of the inorganic insulting film 381 in the non-emission region 410 is reduced compared with that in the emission region 400, by which the second trench 180 can be formed. On the other hand, in FIG. 33B, the second trench 180 is prepared in the organic insulating film 382, and the inorganic insulating film 383 reflects the shape of the second trench 180. In this case, a thickness of the organic insulating film 382 in the non-emission region 410 is reduced compared with that in the emission region 400, which leads to the formation of the second trench 180. As shown in FIG. 33B, two inorganic insulating films 381 and 383 may contact with each other in the non-emission region 410.

Figure 11B:
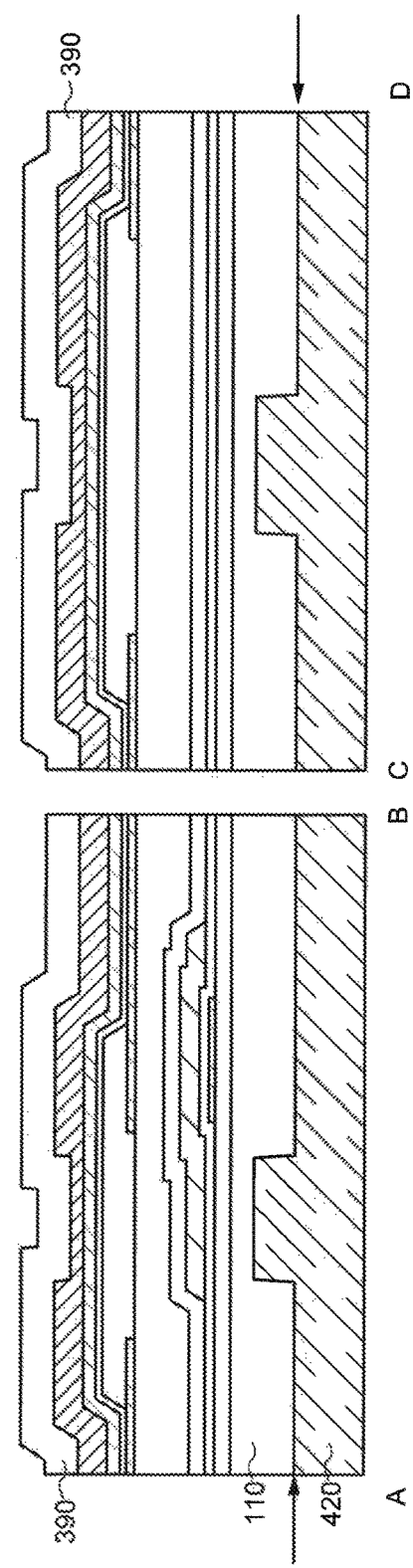

Next, the polarizing plate 390 is formed over the sealing film 380 (FIG. 11B). A linear polarizing plate, a circular polarizing plate, and the like may be used as the polarizing plate 390, and the polarizing plate 390 can be formed by using a lamination method, and the like. Note that the polarizing plate 390 may not be provided. Although not shown, a color filter, a light-shielding film, and the like may be arranged over or under the sealing film 380 and the polarizing plate 390.

Figure 12:
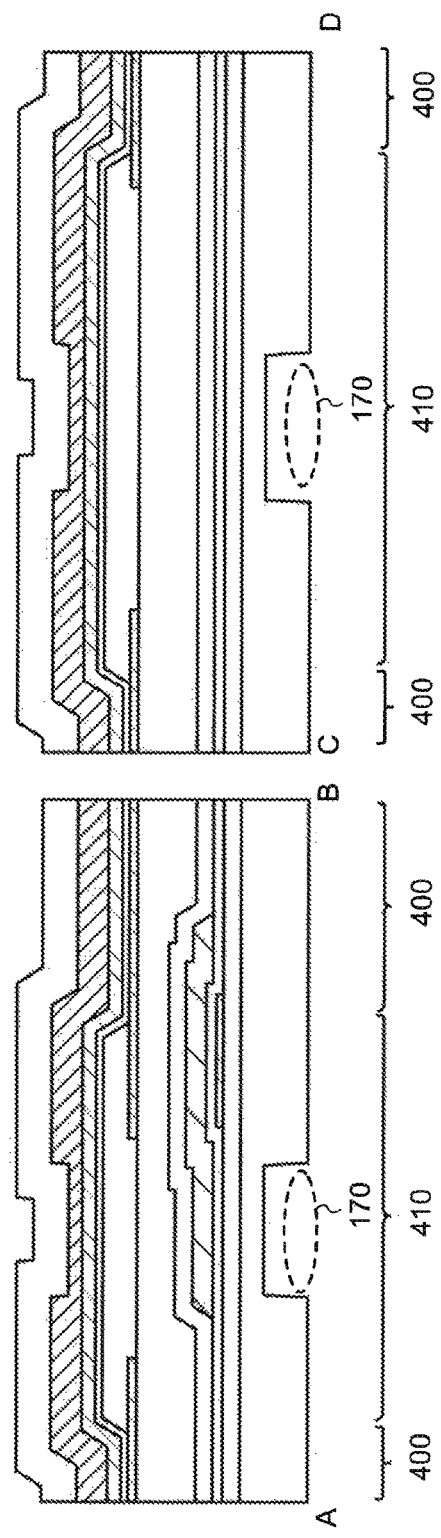
FIG. 12 is a schematic drawing for explaining a manufacturing method of a display device according to an embodiment.

Next, the supporting film 420 is separated from the base material 110 along an interface indicated by an arrow in FIG. 11B (FIG. 12). The separation can be performed by fixing the upper and lower sides of the display device 100 with a suction chuck or the like and physically peeling off the supporting substrate 420. The base material 110 may be irradiated with a laser before the separation in order to reduce adhesion between the base material 110 and the supporting substrate 420.

Through the aforementioned process, the flexible display device 100 in which the thicknesses of the base material 110 and the sealing film 380 are partly small in the non-emission region 410 can be manufactured. In this display device 100, the non-emission region 410 can be selectively deformed, by which the display device 100 can be deformed as a whole without placing stress on the emission region 400. As a result, formation of a display defect can be suppressed, and reliability can be increased.

Third Embodiment

Figure 13A:
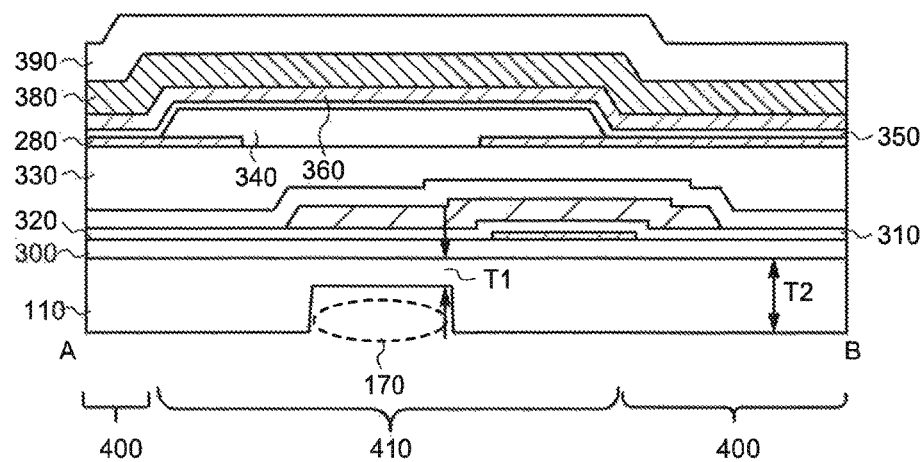
FIG. 13A and FIG. 13B are schematic cross-sectional views of a display device according to an embodiment
Figure 13B:
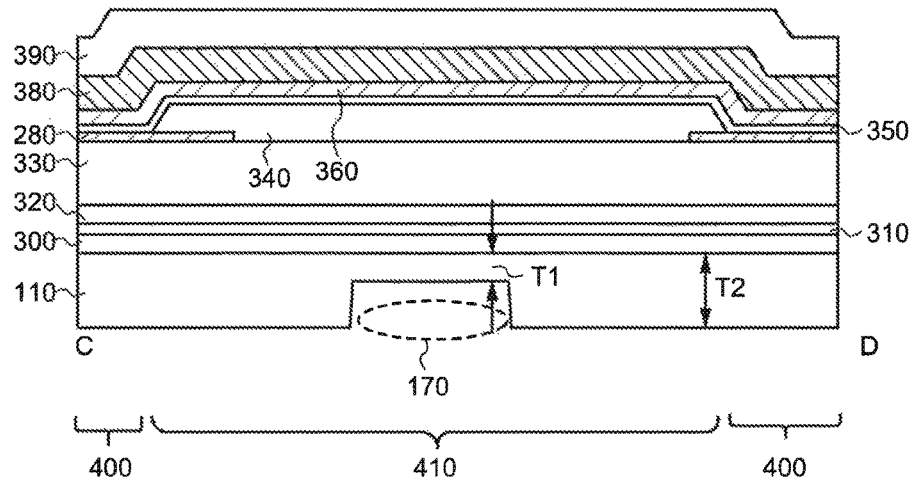

In this embodiment, a pixel 160 having a structure different from that explained in the First and Second Embodiments is explained by using FIG. 13A and FIG. 13B. FIG. 13A and FIG. 13B respectively correspond to the cross sections along straight lines A-B and C-D of FIG. 2B. Explanation of the structures which are the same as those of the First and Second Embodiments is omitted.

As shown in FIG. 13A and FIG. 13B, unlike the First and Second Embodiments, the base material 110 has the first trench 170, while the sealing film 380 does not have the second trench 180 in the pixel 160 of the display device 100 according to the present embodiment. In this case, the thickness of the base material 110 is also reduced in a part of the non-emission region 410. The thickness T1 of the base material 110 in this portion is smaller than the thickness T2 of the base material 110 in the emission region 400. Hence, the non-emission region 410 can be selectively deformed, by which the display device 100 can be deformed as a whole without placing stress on the emission region 400. As a result, formation of a display defect can be suppressed, and reliability can be increased.

Fourth Embodiment

Figure 14:
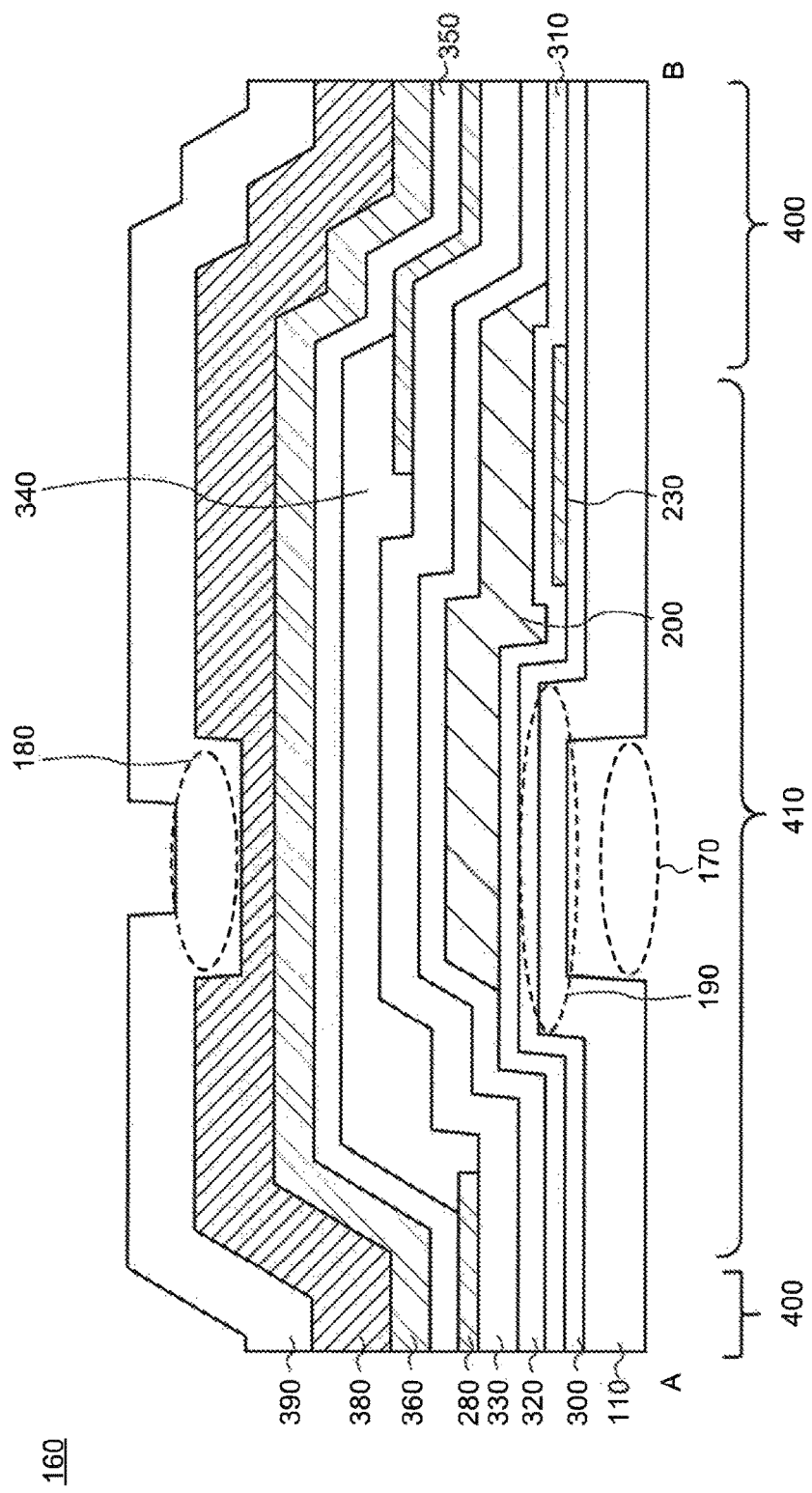
FIG. 14 is a schematic cross-sectional view of a display device according to an embodiment.
Figure 15:
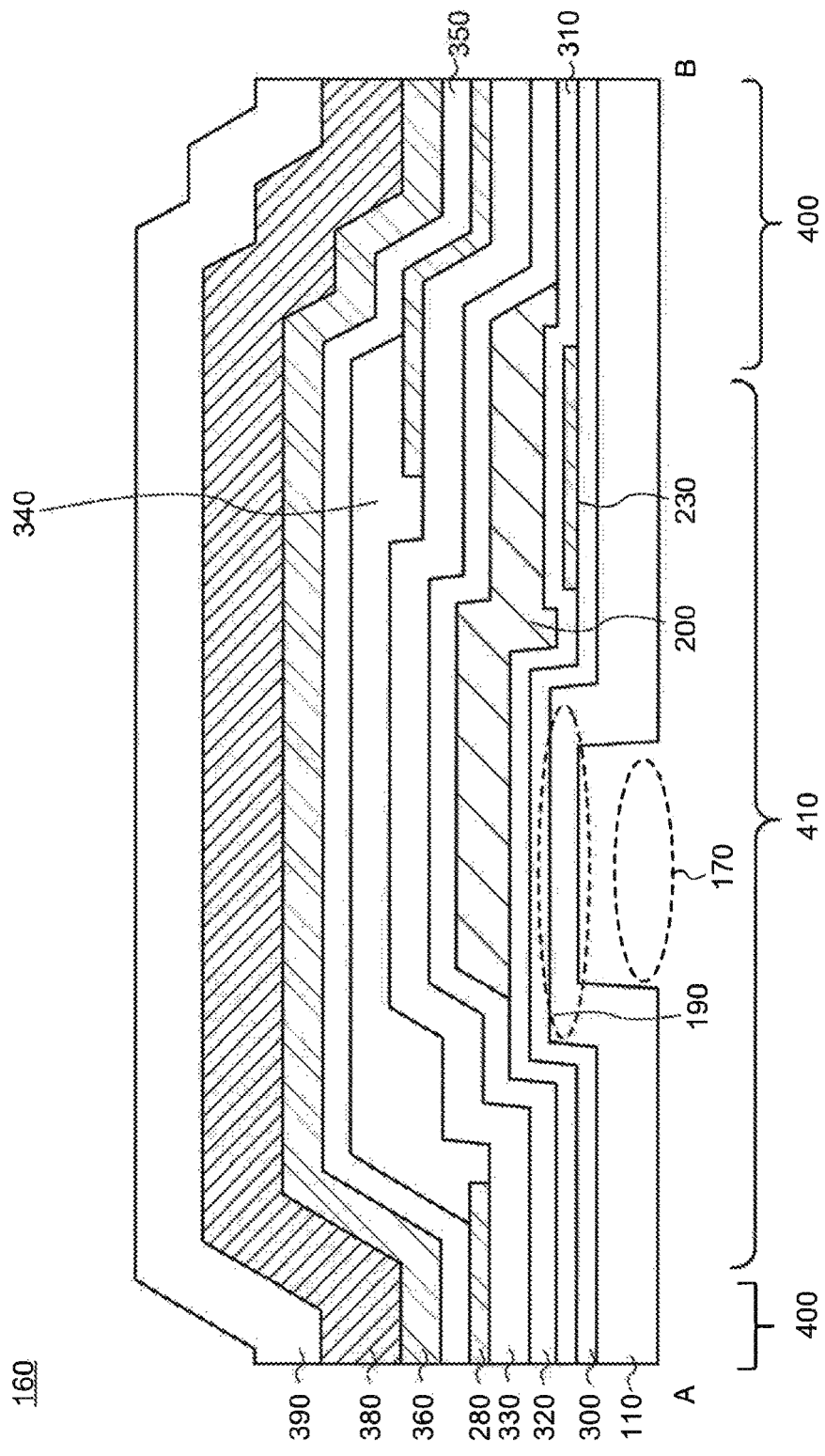
FIG. 15 is a schematic cross-sectional view of a display device according to an embodiment.

In this embodiment, a pixel 160 having a structure different from that explained in the First to Third Embodiments is explained by using FIG. 14 and FIG. 15. FIG. 14 and FIG. 15 correspond to the cross section along straight line A-B of FIG. 2B. Explanation of the structures which are the same as those of the First to Third Embodiments is omitted.

As shown in FIG. 14, the base material 110 of the pixel 160 of the present embodiment has the first trench 170, and the sealing film 380 has the second trench 180. However, unlike the First to Third Embodiments, the base material 110 has a protrusion on its top surface due to the first trench 170. That is, the base material 110 possesses a ridge 190 overlapping with the first trench 170. The ridge 190 can be formed by applying, for example, a lamination method and the like in the formation of the base material 110. Alternatively, the ridge 190 can be formed by reducing the thickness of the base material 110 compared with that of the First to Third Embodiments.

Note that, as shown in FIG. 15, the sealing film 380 of the pixel 160 of the present embodiment may not have the second trench 180 and may possess a flat top surface in a region overlapping with the first trench 170.

The formation of the base material 110 having the ridge 190 allows the thickness of a part of the base material 110 to be further reduced in the non-emission region 410, by which the non-emission region 410 can be more selectively deformed. Hence, stress on the emission region 400 can be further decreased during deformation of the display device 100. As a result, formation of a display defect can be suppressed, and reliability can be increased.

Fifth Embodiment

Figure 16:
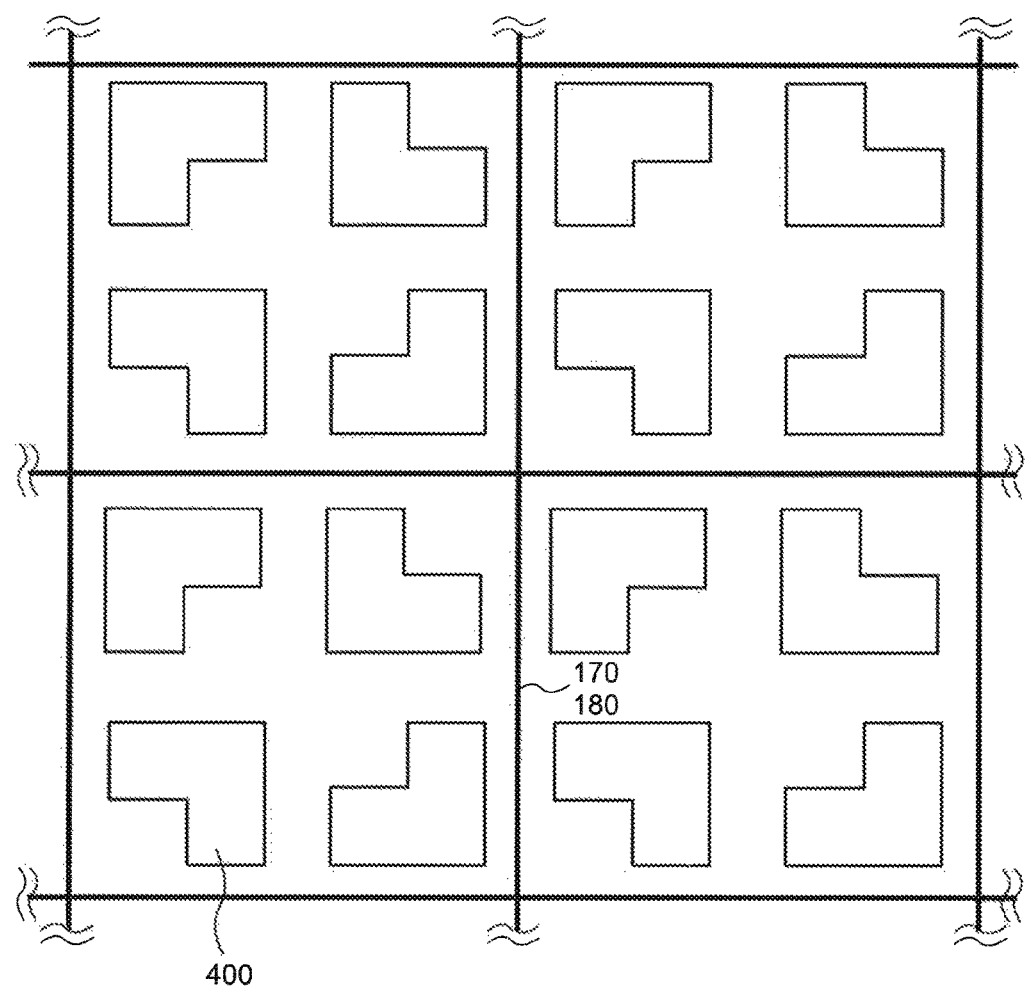
FIG. 16 is a schematic top view of a display device according to an embodiment.
Figure 17:
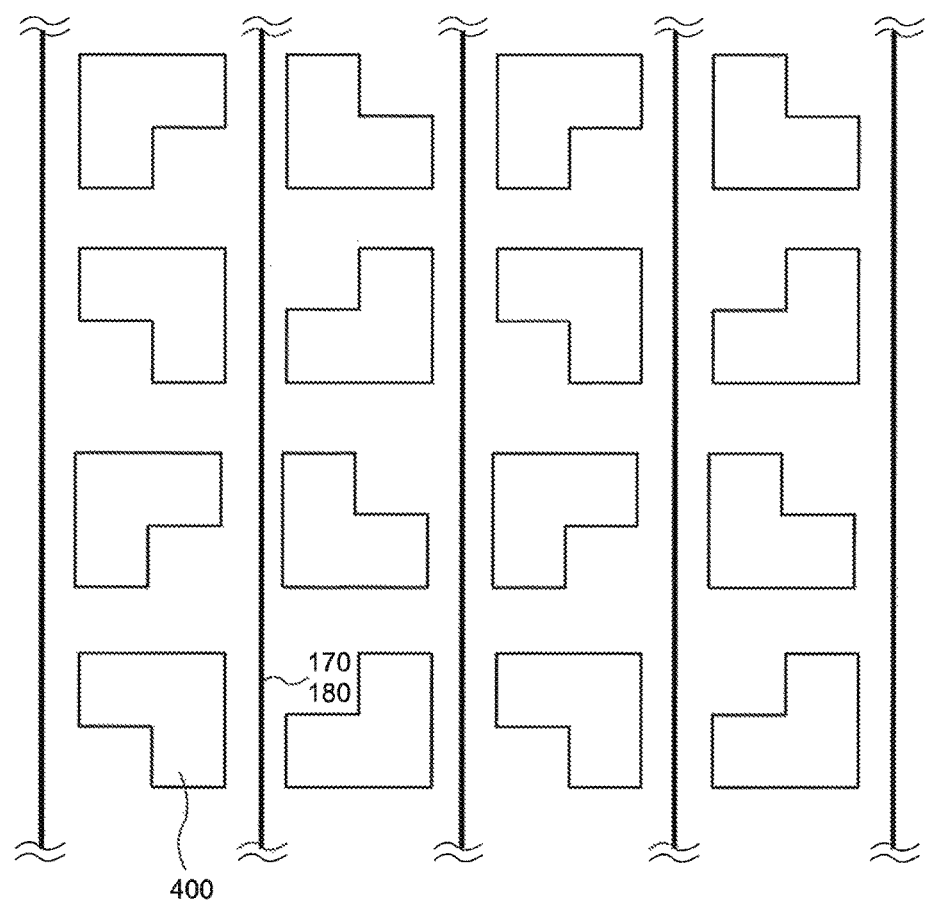
FIG. 17 is a schematic top view of a display device according to an embodiment.
Figure 18:
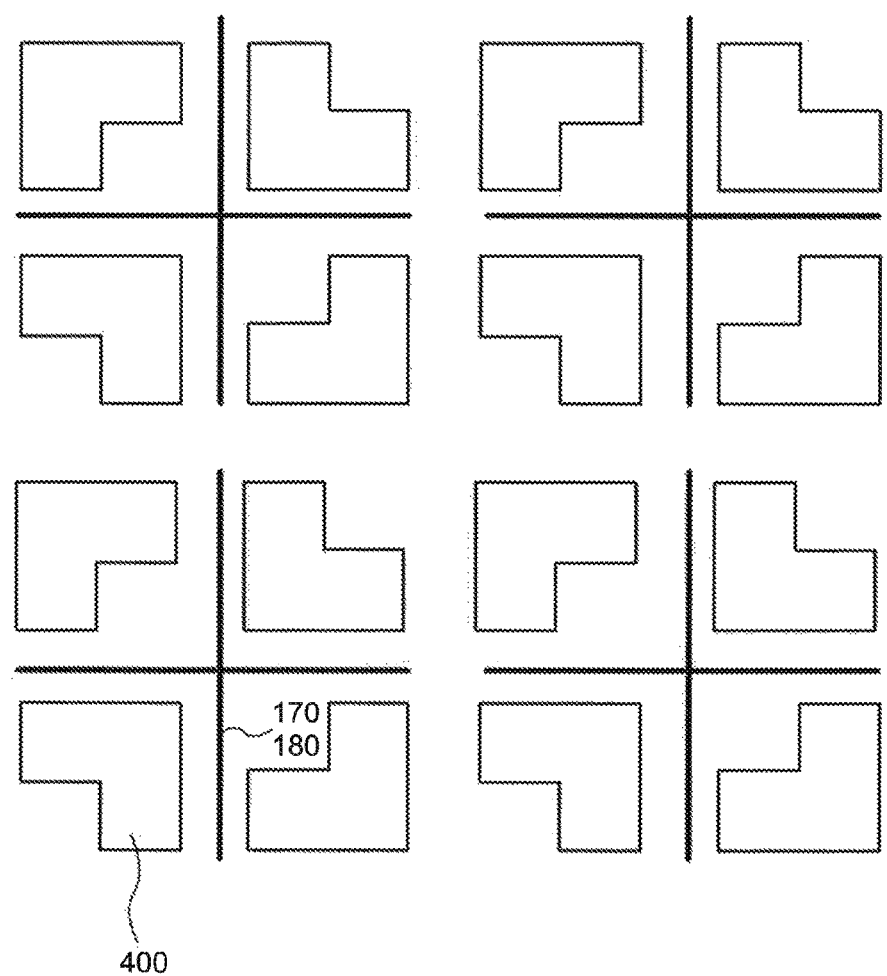
FIG. 18 is a schematic top view of a display device according to an embodiment.

In the present embodiment, a display device 100 different in layout of the first trench 170 and the second trench 180 from those explained in the First to Fourth Embodiments is explained by using FIG. 16 to FIG. 18. Explanation of the structures which are the same as those of the First to Fourth Embodiments is omitted. Note that, in view of visibility, the wirings such as the gate line 200, the signal lines 210, and the current-supplying lines 220 are not illustrated in FIG. 16 to FIG. 18.

As shown in FIG. 5, the display device 100 according to the First Embodiment possesses the first trench 170 and the second trench 180 in all of the non-emission regions 410 between the adjacent pixels 160. In contrast, in the present embodiment, the first trench 170 and the second trench 180 are selectively formed in a part of the non-emission regions 410 as shown in FIG. 16 to FIG. 18.

More specifically, as shown in FIG. 16, the first trench 170 and the second trench 180 are each formed at every plurality of pixels 160 so as to be parallel to the wirings such as the gate line 200, the signal line 210, and the current-supplying line 220. In FIG. 16, the first trench 170 and the second trench 180 are each provided at every two pixels 160, and four pixels 160 are arranged in a matrix form with two rows and two columns in a minimum area demarcated by the first trench 170 and the second trench 180. However, the display device 100 of the present embodiment is not limited to this structure, and the first trench 170 and the second trench 180 may be disposed at every three or four pixels, for example. Furthermore, the number of the pixels 160 in a minimum area demarcated by the first trench 170 and the second trench 180 is not limited, and the numbers of the rows and the columns of the matrix form may be different from each other.

Employment of the structure shown in FIG. 16 enables it to provide physical strength to the display device 100 to some extent compared with the display devices 100 shown in the First to Fourth Embodiments. In other words, flexibility of the display device 100 can be readily controlled.

Alternatively, as shown in FIG. 17, the first trench 170 and the second trench 180 may be formed in a direction which is parallel to only one of the gate line 200 and the signal line 210. In FIG. 17, the first trench 170 and the second trench 180 are formed so as to extend along the signal line 210. Note that the first trench 170 and the second trench 180 may be formed at every plurality of pixels 160. In this case, two adjacent first trenches 170 or two adjacent second trenches 180 are formed so as to sandwich the plurality of pixels 160 arranged in a plurality of rows or columns.

The use of the structure shown in FIG. 17 makes it possible to change flexibility of the display device 100 depending on the bending direction. In the structure of FIG. 17, deformation so as to bend the gate line 200 is easier than deformation so as to bend the signal line 210. As described above, the structure shown in FIG. 17 is suitable for controlling the bending direction of the display device 100.

Alternatively, as shown in FIG. 18, the first trench 170 may be formed to give a plurality of trenches which extend both in a direction parallel to the gate line 200 and in a direction parallel to the signal line 210 and which are divided from one another.

Similar to the structure of FIG. 16, the use of the structure of FIG. 18 is able to provide physical strength to the display device 100 to some extent, by which flexibility of the display device 100 can be readily controlled.

Note that, in the present embodiment, the second trench 180 may not be formed as shown in the Third Embodiment. Furthermore, the shapes of the first trench 170 and the second trench 180 may be different from each other. For example, the first trench 170 may be arranged as shown in FIG. 16, whereas the second trench 180 may be arranged as shown in FIG. 17.

Similar to the First to Fourth Embodiments, in the display device 100 according to the present embodiment, the thicknesses of the base material 110 and the sealing film 380 are partly small in the non-emission region 410. Therefore, the non-emission region 410 can be selectively deformed, by which the whole of the display device 100 can be deformed without placing stress on the emission region 400. As a result, formation of a display defect can be suppressed, and reliability can be increased.

Sixth Embodiment

In the present embodiment, a display device 100 which is different in layout of the first trench 170 and the second trench 180 and layout of the pixel 160 from those explained in the First to Fifth Embodiments is explained by using FIG. 19 to FIG. 22. Explanation of the structures which are the same as those of the First to Fourth Embodiments is omitted. Note that, in view of visibility, the wirings such as the gate line 200, the signal line 210, and the current-supplying line 220 are not illustrated in FIG. 20 and FIG. 22.

Figure 19A:
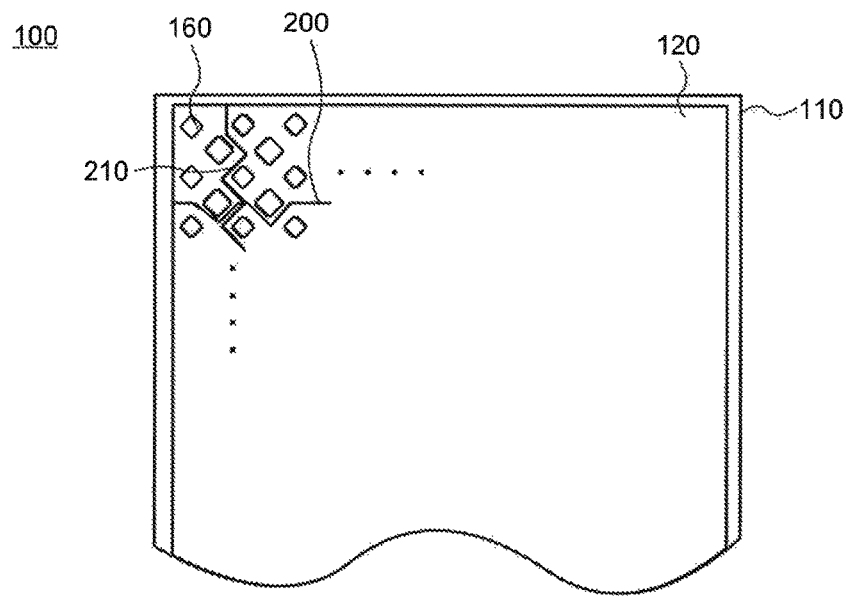
FIG. 19A and FIG. 19B are schematic top views of a display device according to an embodiment.

As shown in FIG. 19A, the pixels 160 has a Pentile arrangement in the display device 100 of the present embodiment. Although the gate lines 200 and the signal lines 210 have a bent structure in every pixel, they extend in the direction of the short side or the long side of the display region 120 as a whole. Note that, the arrangement of the pixels 160 in the display device 100 of the present embodiment is not limited to the Pentile arrangement and may be a stripe arrangement and a mosaic arrangement. The shape of the emission region 400 is a diamond shape in FIG. 19A. However, the shape of the emission region 400 is not limited thereto and may be circular or polygonal such as square and rectangular. The shape of the corner of the emission region 400 is also not limited to a curved shape.

Figure 19B:
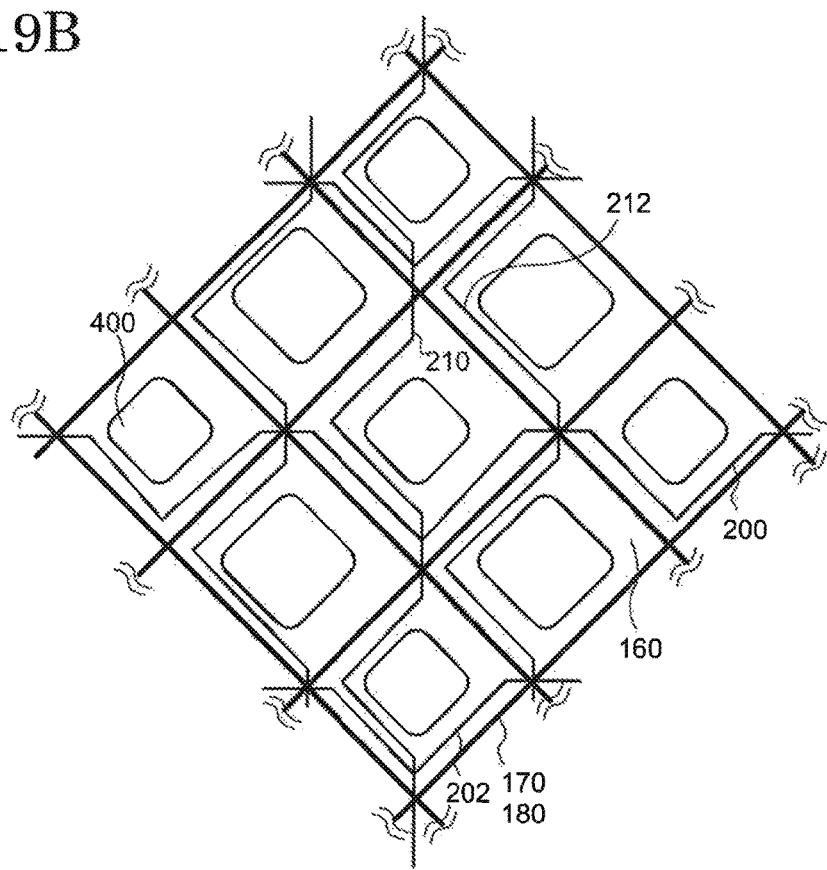

As shown in FIG. 19B, the first trenches 170 and the second trenches 180 of the display device 100 of the present embodiment extend in a direction inclined from the short side or the long side of the display region 120. Therefore, the first trenches 170 intersect with each of the gate line 200, the signal line 210, and the current-supplying line 220. Similarly, the second trenches 180 intersect with each of the gate line 200, the signal line 210, and the current-supplying line 220.

Formation of the first trenches 170 and the second trenches 180 in the layout shown in FIG. 19B facilitates bending or folding of the display device 100 in a direction inclined from the short side or the long side of the display region 120.

Figure 20:
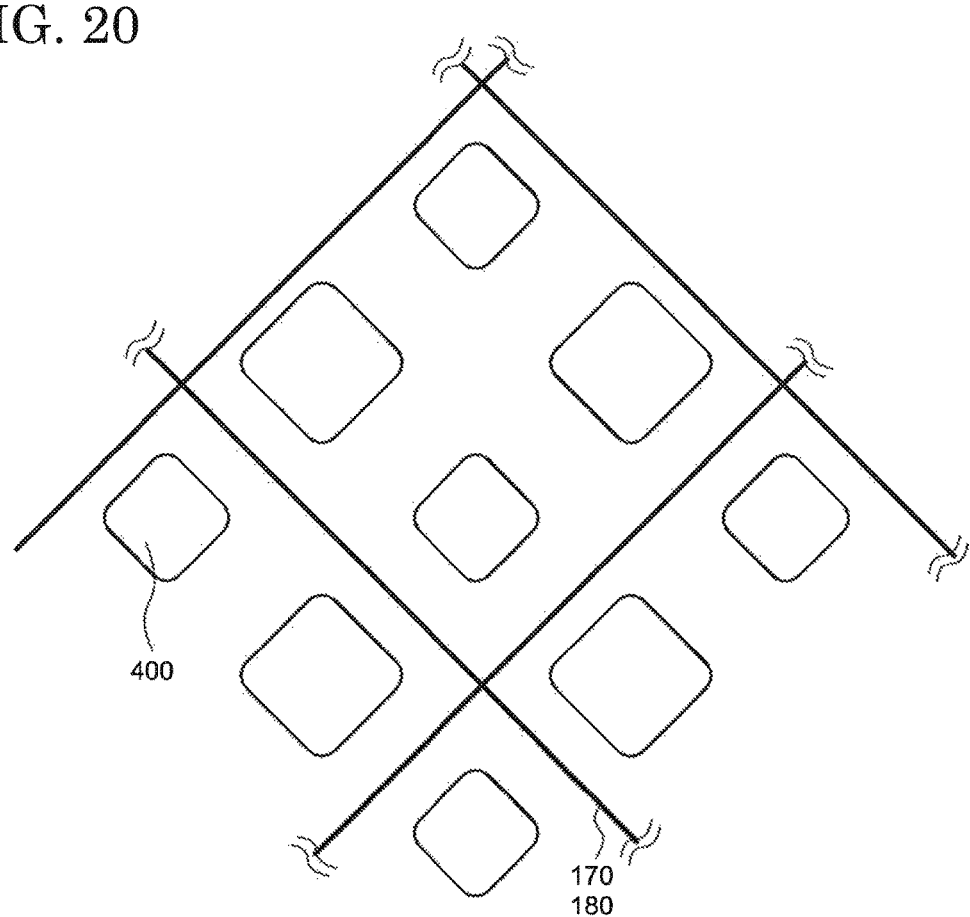
FIG. 20 is a schematic top view of a display device according to an embodiment.

Alternatively, as shown in FIG. 20, the first trenches 170 and the second trenches 180 each can be formed at every plurality of pixels 160. In FIG. 20, the first trenches 170 and the second trenches 180 are formed at every two pixels 160, and four pixels 160 are arranged in a minimum area demarcated by the first trenches 170 and the second trenches 180. However, the display device 100 of the present embodiment is not limited to this structure, and the first trenches 170 and the second trenches 180 may be fabricated at every three or four pixels 160. Additionally, the number of the pixels 160 included in a minimum area demarcated by the first trenches 170 and the second trenches 180 is not limited.

Compared with the display devices 100 shown in the First to Fourth Embodiments, employment of the structure shown in FIG. 20 is able to provide physical strength to the display device 100 to some extent. In other words, flexibility of the display device 100 can be readily controlled.

Figure 21:
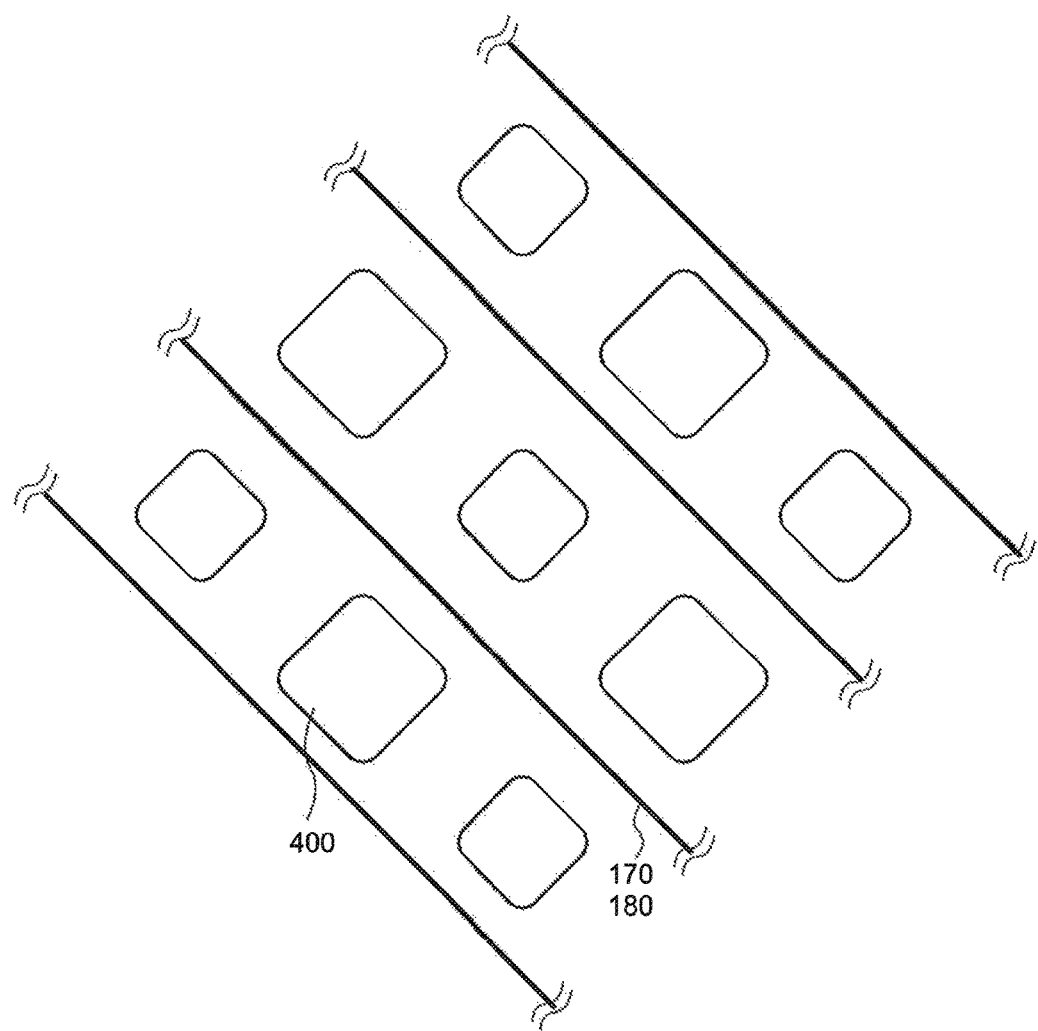
FIG. 21 is a schematic top view of a display device according to an embodiment.

Alternatively, as shown in FIG. 21, the first trenches 170 and the second trenches 180 may be formed so as to extend in a single direction. That is, all of the first trenches 170 and the second trenches 180 may be formed to have vectors with the same direction.

The use of the structure shown in FIG. 21 more significantly facilitates deformation in a single direction inclined from the short side and the long side of the display region 120. That is, control of the deformation direction is feasible.

Figure 22:
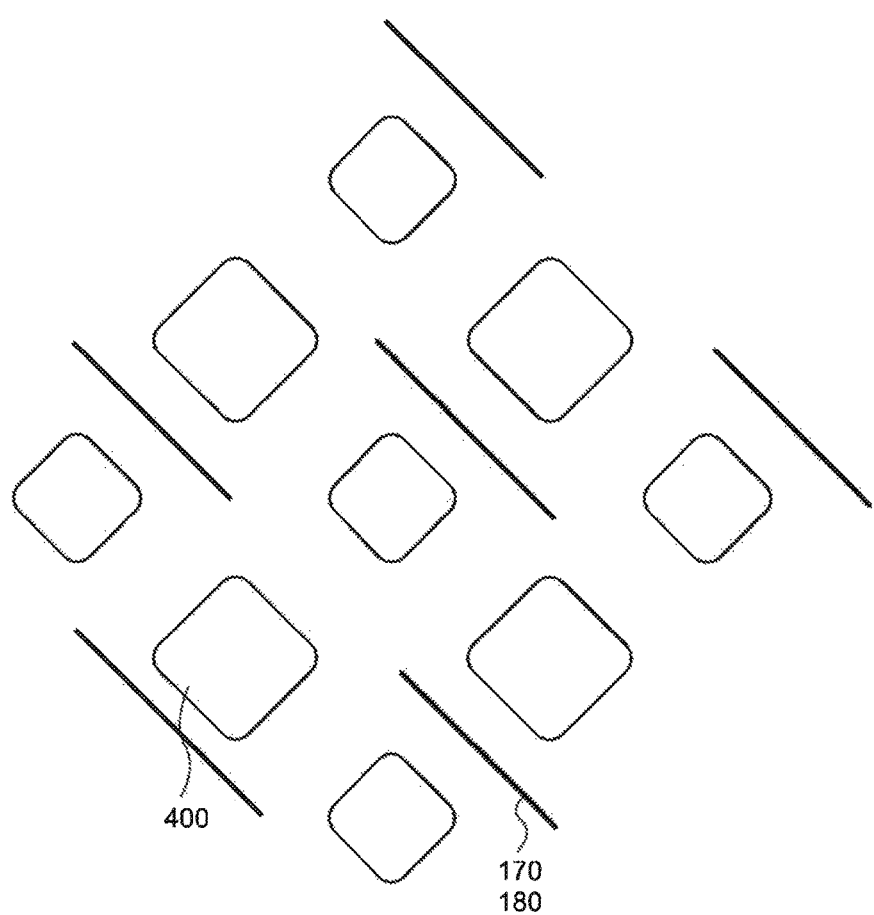
FIG. 22 is a schematic top view of a display device according to an embodiment.

Alternatively, as shown in FIG. 22, the first trenches 170 may be formed so as to provide a plurality of trenches which extend in a single direction and are divided from one another. The second trenches 180 may also have the same structure and can be formed so as to provide a plurality of trenches which extend in a single direction and are divided from one another. In this case, the first trenches 170 and the second trenches 180 each have vectors with the same direction.

Employment of the structure of FIG. 22 enables it to provide physical strength to the display device 100 to some extent, which facilitates controlling flexibility of the display device 100.

Note that, in the present embodiment, the second trenches 180 may not be formed as shown in the Third Embodiment. Moreover, the shapes of the first trenches 170 and the second trenches 180 may be different from each other. For example, the first trenches 170 may be arranged as shown in FIG. 19, whereas the second trenches may be arranged as shown in FIG. 20.

Similar to the First to Fifth Embodiment, in the display device 100 according to the present embodiment, the thicknesses of the base material 110 and the sealing film 380 are partly small in the non-emission region 410. Therefore, the non-emission region 410 can be selectively deformed, by which the whole of the display device 100 can be deformed without placing stress on the emission region 400. As a result, formation of a display defect can be suppressed, and reliability can be increased.

Seventh Embodiment

In the present embodiment, a display device 100 different in shape of the first trench 170 and the second trench 180 from those explained in the First to Sixth Embodiments is explained by using FIG. 23 to FIG. 26. Explanation of the structures which are the same as those of the First to Sixth Embodiments is omitted. Note that, in view of visibility, the wirings such as the gate line 200, the signal line 210, and the current-supplying line 220 are not illustrated in FIG. 24 to FIG. 26.

Figure 23:
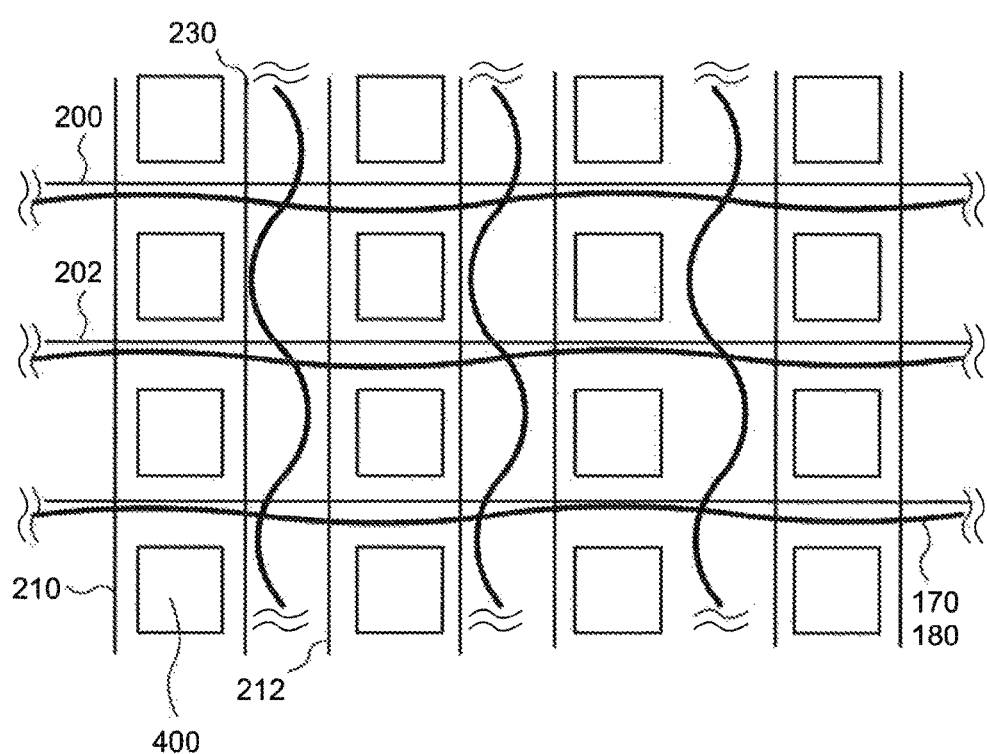
FIG. 23 is a schematic top view of a display device according to an embodiment.

In the display device 100 of the present embodiment, the first trench 170 and the second trench 180 are formed to be expressed with a curve. Specifically, as shown in FIG. 23, for example, the first trench 170 and the second trench 180 have a wave shape and extend along one of the gate line 200, the signal line 210, and the current-supplying line 220. Formation of the first trench 170 and the second trench 180 in such a shape allows the display device 100 to be deformed in a variety of directions.

Figure 24:
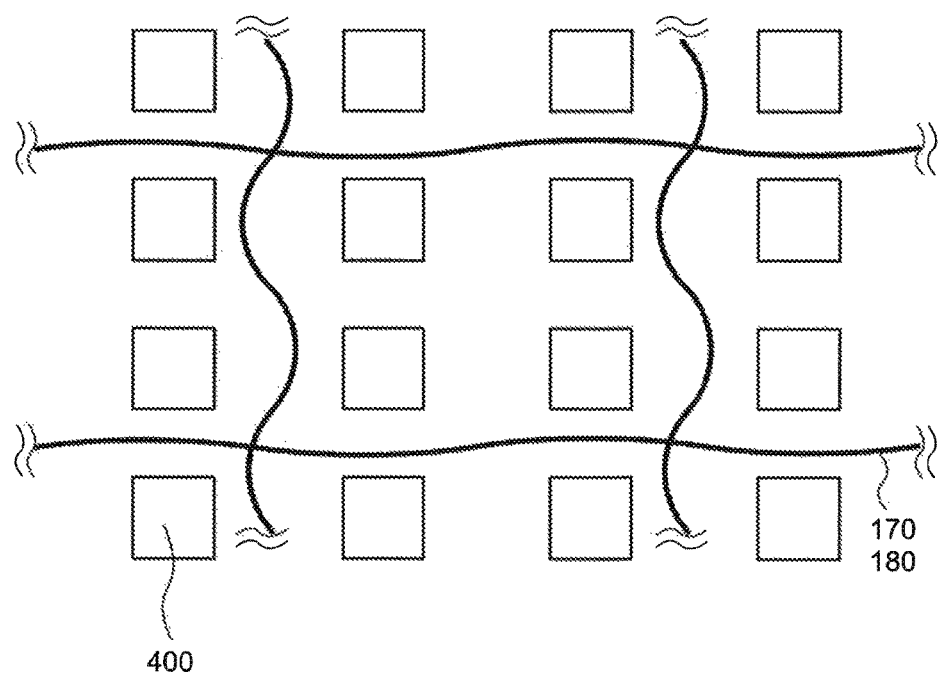
FIG. 24 is a schematic top view of a display device according to an embodiment.

Alternatively, as shown in FIG. 24, the first trench 170 and the second trench 180 can be formed to have a wave shape at every plurality of pixels 160. In FIG. 24, the first trench 170 and the second trench 180 are formed at every two pixels 160, and four pixels 160 are arranged in a matrix form with two rows and two columns in a minimum area demarcated by the first trench 170 and the second trench 180. Note that the display device 100 of the present embodiment is not limited to this structure, and the first trench 170 and the second trench 180 may be formed at every three or four pixels, for example. Moreover, the number of the pixels 160 included in a minimum area demarcated by the first trench 170 and the second trench 180 is not limited, and the numbers of the rows and the columns of the matrix may be different from each other.

Employment of the structure shown in FIG. 24 enables it to provide physical strength to the display device 100 to some extent compared with the display devices 100 shown in the First to Fourth Embodiments. In other words, flexibility of the display device 100 can be readily controlled.

Figure 25:
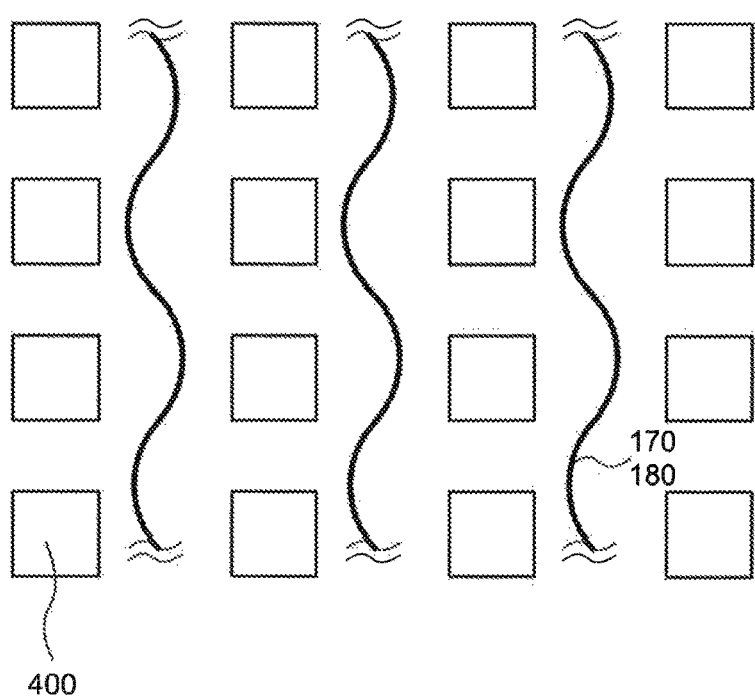
FIG. 25 is a schematic top view of a display device according to an embodiment.
Figure 26:
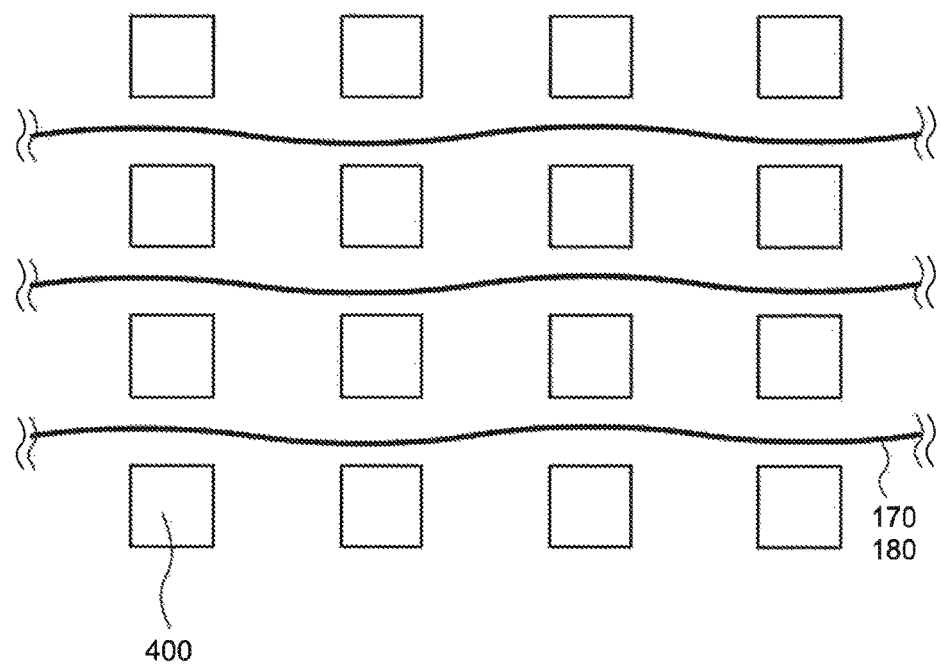
FIG. 26 is a schematic top view of a display device according to an embodiment.

Alternatively, as shown in FIG. 25 and FIG. 26, the first trench 170 and the second trench 180 may be formed so as to have a wave shape and extend in a direction parallel to only one of the gate line 200 and the signal line 210. The first trench 170 and the second trench 180 may be formed at every plurality of pixels 160. In this case, adjacent first trenches 170 or adjacent second trenches 180 are formed so as to sandwich the pixels 160 arranged in a plurality of rows or columns.

The use of the structures shown in FIG. 25 and FIG. 26 allows the flexibility to be changed depending on the bending direction of the display device 100. In the structure of FIG. 25, it is easier to bend the display device 100 so as to bend the gate line 200 than the signal line 210. On the contrary, in the structure of FIG. 26, deformation of the display device 100 so as to bend the signal line 210 is easier than deformation so as to bend the gate line 200. Thus, the structures shown in FIG. 24 and FIG. 25 are suitable for controlling the bending direction of the display device 100.

Note that, in the present embodiment, the second trench 180 may not be provided as shown in the Third Embodiment. Moreover, the first trench 170 and the second trench 180 may be different in shape from each other. For example, the first trench 170 may be arranged as shown in FIG. 23, while the second trench 180 may be arranged as shown in FIG. 24.

Similar to the First to Sixth Embodiments, in the display device 100 according to the present embodiment, the thicknesses of the base material 110 and the sealing film 380 are partly small in the non-emission region 410. Therefore, the non-emission region 410 can be selectively deformed, by which the whole of the display device 100 can be deformed without placing stress on the emission region 400. As a result, formation of a display defect can be suppressed, and reliability can be increased.

Eighth Embodiment

Figure 27:
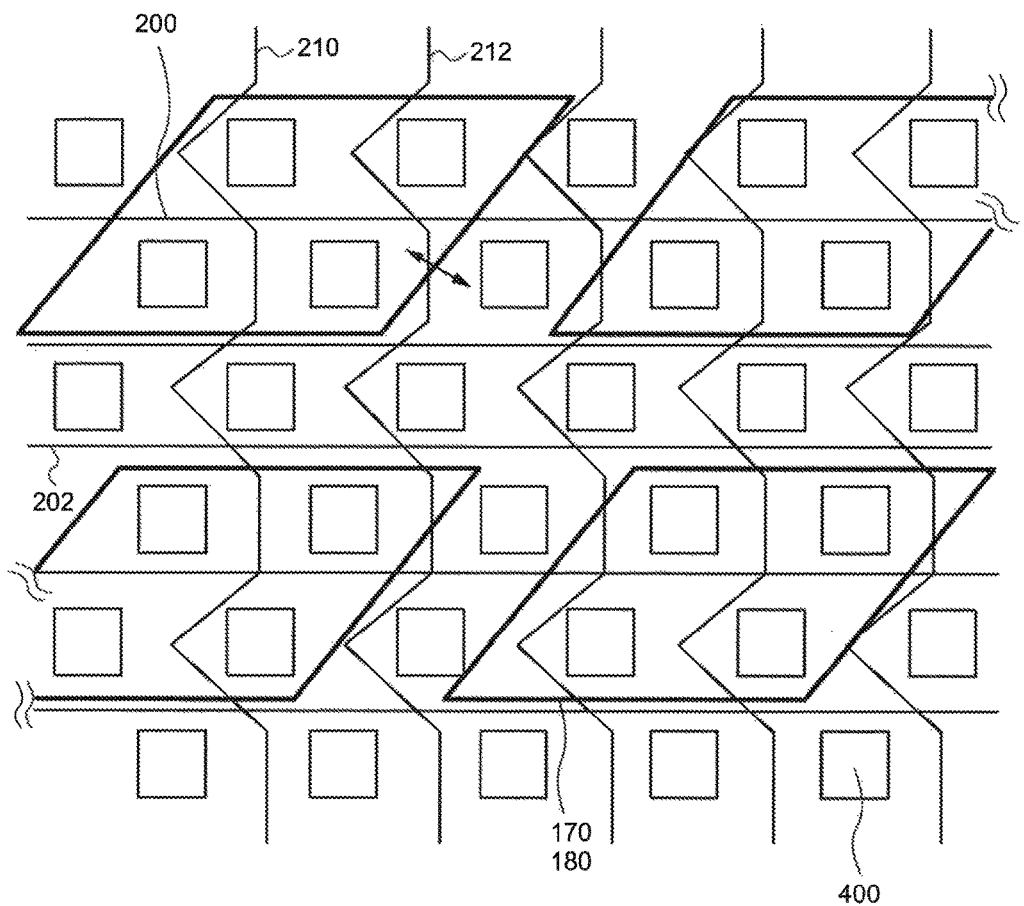
FIG. 27 is a schematic top view of a display device according to an embodiment.
Figure 28:
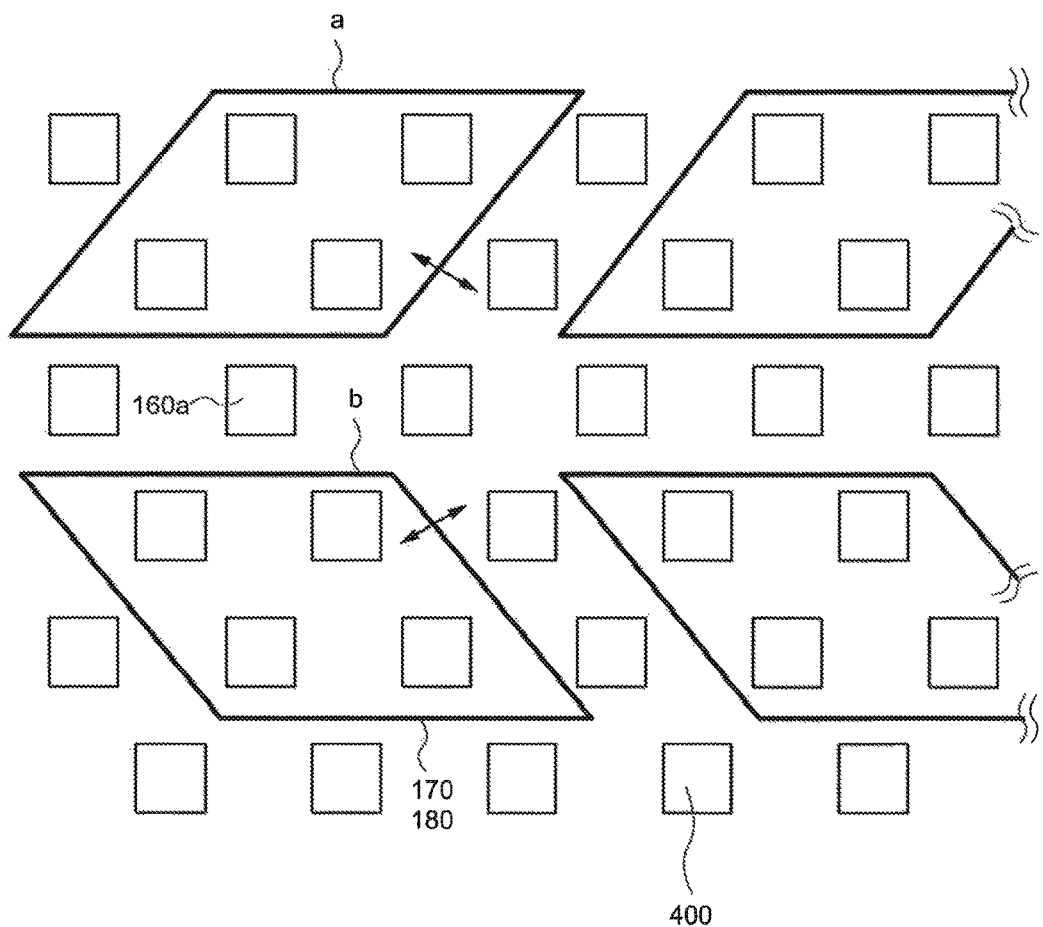
FIG. 28 is a schematic top view of a display device according to an embodiment.

In the present embodiment, a display device 100 different in shape of the first trench 170 and the second trench 180 from those explained in the First to Seventh Embodiments is explained by using FIG. 27 and FIG. 28. Explanation of the structures which are the same as those of the First to Seventh Embodiments is omitted. Note that, in view of visibility, the wirings such as the gate line 200, the signal line 210, and the current-supplying line 220 are not illustrated in FIG. 28.

In the display device 100 according to the present embodiment, the first trenches 170 are independent from one another and give a plurality of closed plane shapes. Similarly, the second trenches 180 are also independent from one another and give a plurality of closed plane shapes. For example, as shown in FIG. 27, the display device 100 possesses the pixels 160 in a delta arrangement, and the first trenches 170 and the second trenches 180 are formed so as to surround four adjacent pixels 160 and give a closed parallelogram.

In this structure, four pixels 160 are arranged in a minimum area demarcated by each of the first trench 170 and the second trench 180. However, the display device 100 of the present embodiment is not limited to having this structure, and the number of the pixels included in a minimum area demarcated by each of the first trench 170 and the second trench 180 is not limited. Additionally, the arrangement of the pixels 160 is not limited to the delta arrangement, and the closed shape provided by the first trench 170 and the second trench 180 is not limited to a parallelogram.

Employment of the structure shown in FIG. 27 enables it to provide physical strength to the display device 100 to some extent compared with the display devices 100 shown in the First to Fourth Embodiments. In other words, flexibility of the display device can be readily controlled. Furthermore, deformation is facilitated in not only the short side direction and the long side direction of the display region 120 but also in a diagonal direction (direction of an arrow in FIG. 27).

As shown in FIG. 28, in the display device 100 according to the present embodiment, the closed plane shapes provided by the first trench 170 and the second trench 180 may be in line symmetry with each other. In the display device 100 exemplified in FIG. 28, a pair of closed shapes a and b is in line symmetry with respect to a line including the pixel 160a. Employment of such a structure also facilitates deformation not only in the short side and long side directions of the display region 120 but also in two diagonal directions (directions of arrows in FIG. 28).

Note that, in the present embodiment, the second trench 180 may not be formed as shown in the Third Embodiment. Moreover, the first trench 170 and the second trench 180 may be different in shape from each other. For example, the first trench 170 may be arranged to give the shape shown in FIG. 27, whereas the second trench 180 may be arranged to give the shape shown in FIG. 28.

Similar to the First to Seventh Embodiments, in the display device 100 according to the present embodiment, the thicknesses of the base material 110 and the sealing film 380 are partly small in the non-emission region 410. Therefore, the non-emission region 410 can be selectively deformed, by which the whole of the display device 100 can be deformed without placing stress on the emission region 400. As a result, formation of a display defect can be suppressed, and reliability can be increased.

Ninth Embodiment

Figure 29:
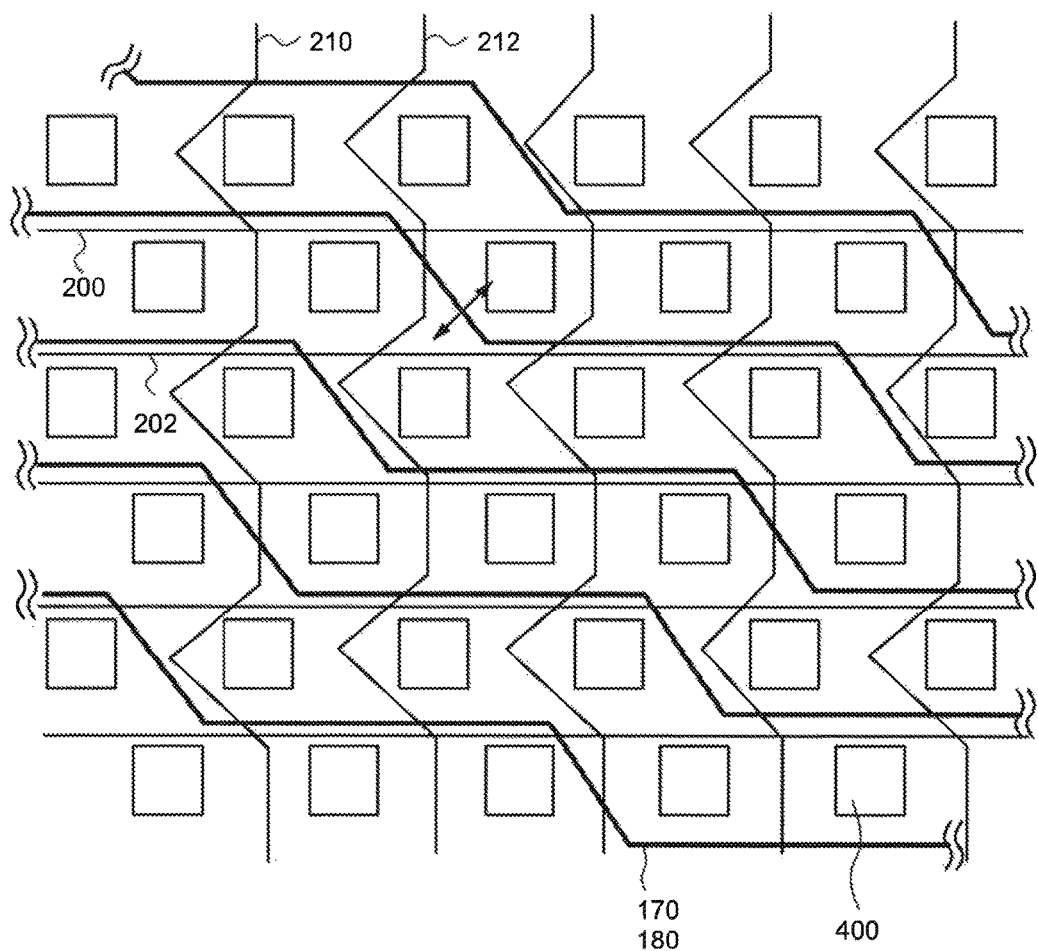
FIG. 29 is a schematic top view of a display device according to an embodiment.
Figure 30:
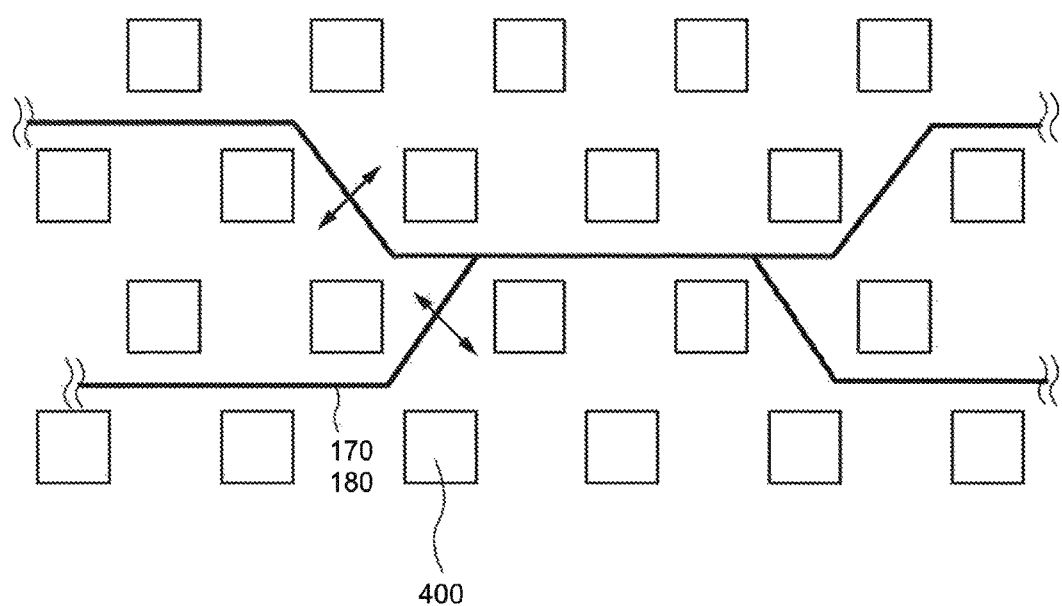
FIG. 30 is a schematic top view of a display device according to an embodiment.

In the present embodiment, a display device 100 different in shape of the first trench 170 and the second trench 180 from those explained in the First to Eighth Embodiments is explained by using FIG. 29 and FIG. 30. Explanation of the structures which are the same as those of the First to Seventh Embodiments is omitted. Note that, in view of visibility, the wirings such as the gate line 200, the signal line 210, and the current-supplying line 220 are not illustrated in FIG. 30.

As shown in FIG. 29, in the display device 100 according to the present embodiment, the plurality of first trenches 170 and the plurality of second trenches 180 have a zigzag structure and each intersect with the signal line 210 diagonally in a region sandwiched by two adjacent pixels 160 which are arranged along the gate line 200. Furthermore, vectors of the plurality of first trenches 170 are the same as one another in this region. The use of such a structure facilitates deformation not only in the long side direction of the display region 120 but also in the diagonal direction (direction of an arrow in FIG. 29).

Alternatively, as shown in FIG. 30, the plurality of first trenches 170 and the plurality of second trenches 180 have a zigzag structure and each intersect with the signal line 210 diagonally in a region sandwiched by two adjacent pixels 160 which are arranged along the gate line 200. Additionally, the first trenches 170 are formed so that a vector of the first trench 170 in this region is different from that of the adjacent first trench 170. In a similar way, the second trenches 180 are formed so that a vector of the second trench 170 in this region is different from that of the adjacent second trench 170. The use of such a structure facilitates deformation not only in the long side direction of the display region 120 but also in two diagonal directions (directions of arrows in FIG. 30).

Note that, in the present embodiment, the second trench 180 may not be formed as shown in the Third Embodiment. Moreover, the first trench 170 and the second trench 180 may be different in shape from each other. For example, the first trench 170 may be arranged to give the shape shown in FIG. 29, whereas the second trench 180 may be arranged to give the shape shown in FIG. 30.

Similar to the First to Eighth Embodiments, in the display device 100 according to the present embodiment, the thicknesses of the base material 110 and the sealing film 380 are partly small in the non-emission region 410. Therefore, the non-emission region 410 can be selectively deformed, by which the whole of the display device 100 can be deformed without placing stress on the emission region 400. As a result, formation of a display defect can be suppressed, and reliability can be increased.

Tenth Embodiment

Figure 31:
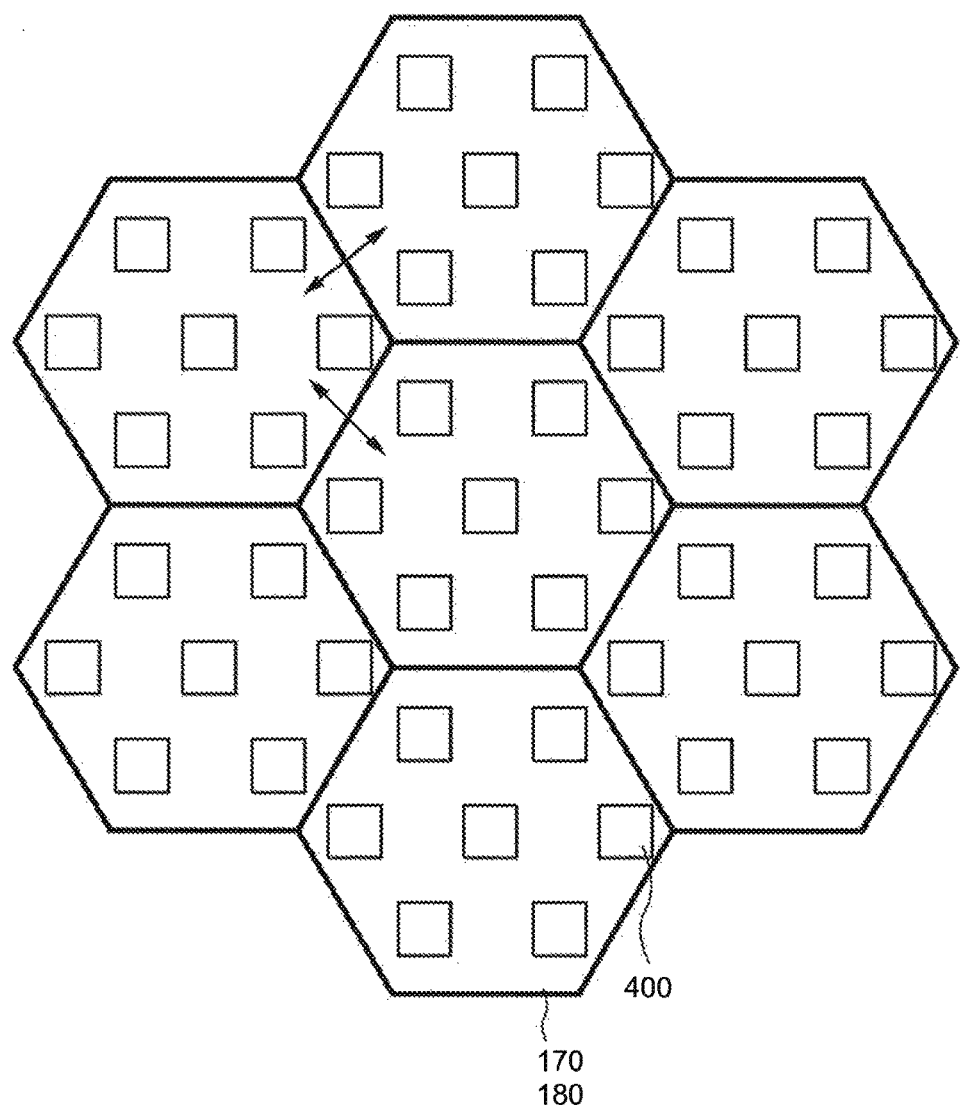
FIG. 31 is a schematic top view of a display device according to an embodiment.
Figure 32:
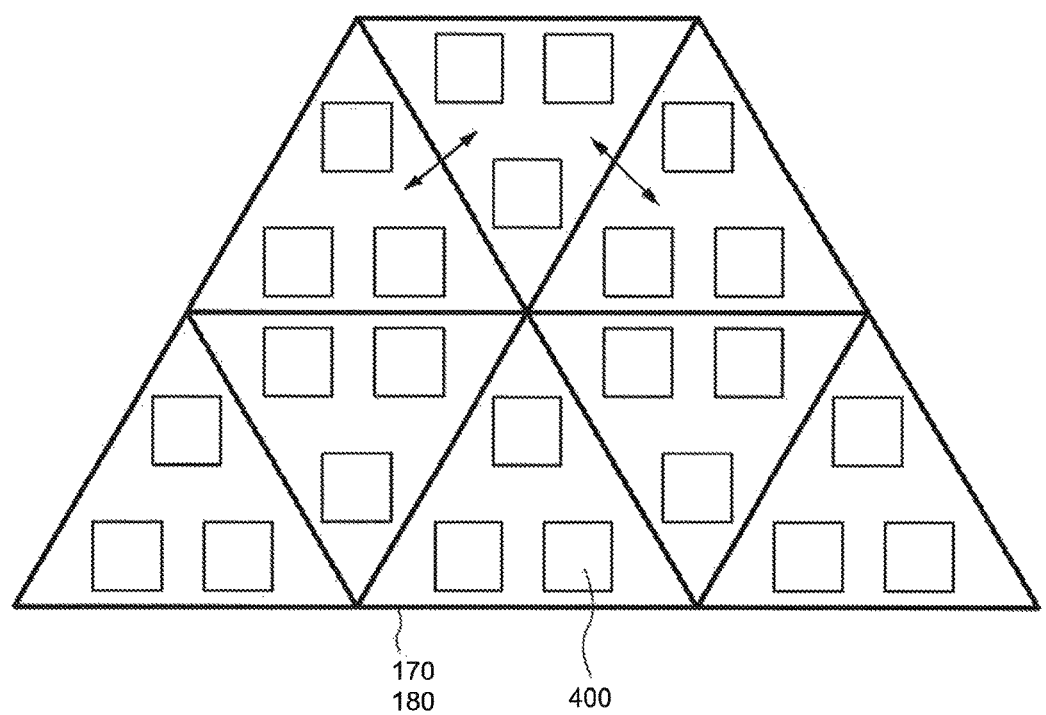
FIG. 32 is a schematic top view of a display device according to an embodiment.

In the present embodiment, a display device 100 different in shape of the first trench 170 and the second trench 180 from those explained in the First to Ninth Embodiments is explained by using FIG. 31 and FIG. 32. Explanation of the structures which are the same as those of the First to Ninth Embodiments is omitted. Note that, in view of visibility, the wirings such as the gate line 200, the signal line 210, and the current-supplying line 220 are not illustrated in FIG. 31 and FIG. 32.

In the display device 100 according to the present embodiment, the first trench 170 and the second trench 180 are formed so that a plurality of closed polygons is provided and that a side is shared by the adjacent polygons. As shown in FIG. 31, for example, the first trench 170 is formed to give hexagons with closed shapes. Furthermore, the adjacent hexagons share one side. Hence, the plurality of closed shapes form a honeycomb pattern.

Seven pixels 160 are included in one closed shape among which six pixels are located at the vertexes of the hexagon. However, the present embodiment is not limited to such a mode, and the number of the pixels 160 included in one closed shape is not limited to seven.

Moreover, the polygon with a closed shape is not limited to a hexagon and may be a triangle as shown in FIG. 32. In this case, one side of the triangle is also shared by the adjacent triangles. In FIG. 32, three pixels 160 are included in one triangle with a closed shape. However, the present embodiment is not limited thereto, and four or more pixels 160 may be included. The use of such a structure facilitates deformation not only in the long side direction of the display region 120 but also in two diagonal directions (directions of arrows in FIG. 31 and FIG. 32).

Note that, in the present embodiment, the second trench 180 may not be formed as shown in the Third Embodiment. Moreover, the first trench 170 and the second trench 180 may be different in shape from each other. For example, the first trench 170 may be arranged to give the shape shown in FIG. 31, whereas the second trench 180 may be arranged to give the shape shown in FIG. 32.

Similar to the First to Ninth Embodiments, in the display device 100 according to the present embodiment, the thicknesses of the base material 110 and the sealing film 380 are partly small in the non-emission region 410. Therefore, the non-emission region 410 can be selectively deformed, by which the whole of the display device 100 can be deformed without placing stress on the emission region 400. As a result, formation of a display defect can be suppressed, and reliability can be increased.

The aforementioned modes described as the embodiments of the present invention can be implemented by being appropriately combined with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

In the specification, although cases of the organic EL display device are exemplified, the embodiments can be applied to any kind of display devices of a flat panel type such as other self-emission type display devices, liquid crystal display devices, and electronic paper type display device having electrophoretic elements and the like. In addition, it is apparent that the size of the display device is not limited, and the embodiment can be applied to display devices having any size from medium to large.

It is properly understood that another effect different from that provided by the modes of the aforementioned embodiments is achieved by the present invention if the effect is obvious from the description in the specification or readily conceived by the persons ordinarily skilled in the art.

What is claimed is:

1. A display device comprising:
   a base material;
   a plurality of light-emitting elements over a first surface of the base material, the plurality of light-emitting elements each having an emission region; and
   a first trench over a second surface of the base material, the first trench overlapping with a non-emission region sandwiched between the emission regions of two adjacent light-emitting elements selected from the plurality of light-emitting elements.

2. The display device according to claim 1,
   wherein a thickness of the base material in the first trench is smaller than a thickness of the base material in the emission regions.

3. The display device according to claim 1, further comprising an inorganic insulating film over the light-emitting elements,
   wherein the inorganic insulating film comprises a second trench overlapping with the first trench.

4. The display device according to claim 3,
   wherein the second trench extends along the first trench.

5. The display device according to claim 1, further comprising:
   an inorganic insulating film over the light-emitting elements; and
   an organic insulating film over the inorganic insulating film,
   wherein the organic insulating film comprises a second trench overlapping with the first trench.

6. The display device according to claim 5,
   wherein the second trench extends along the first trench.

7. The display device according to claim 5,
   wherein a thickness of the inorganic insulating film and a thickness of the organic insulating film in a region in which the second trench is located are respectively smaller than a thickness of the inorganic insulating film and a thickness of the organic insulating film in a region in which the second trench is not located.

8. The display device according to claim 3, further comprising a gate line, a signal line, and a current-supplying line over the first surface of the base material,
   wherein the first trench and the second trench overlap with at least one of the gate line, the signal line, and the current-supplying line.

9. The display device according to claim 8,
   wherein each of the first trench and the second trench extends along at least one of the gate line, the signal line, and the current-supplying line.

10. The display device according to claim 1,
    wherein the base material has flexibility.

11. A display device comprising:
    a base material;
    a plurality of pixels over a first surface of the base material, the plurality of pixels each having a light-emitting element;
    a first trench over a second surface of the base material, the first trench overlapping with a region sandwiched between two adjacent pixels selected from the plurality of pixels; and
    a ridge over the first surface of the base material, the ridge overlapping with the first trench and consisting of the base material.

12. The display device according to claim 11,
wherein a thickness of the base material in the first trench is smaller than a thickness of the base material under the emission regions of the light-emitting elements.

13. The display device according to claim 11, further comprising an inorganic insulating film over the light-emitting elements,
wherein the inorganic insulating film comprises a second trench overlapping with the first trench.

14. The display device according to claim 13,
wherein the second trench extends along the first trench.

15. The display device according to claim 11, further comprising:
an inorganic insulating film over the light-emitting elements; and
an organic insulating film over the inorganic insulating film,
wherein the organic insulating film comprises a second trench overlapping with the first trench.

16. The display device according to claim 15,
wherein the second trench extends along the first trench.

17. The display device according to claim 15,
wherein a thickness of the inorganic insulating film and a thickness of the organic insulating film in a region in which the second trench is located are respectively smaller than a thickness of the inorganic insulating film and a thickness of the organic insulating film in a region in which the second trench is not located.

18. The display device according to claim 13, further comprising a gate line, a signal line, and a current-supplying line over the first surface of the base material,
wherein the first trench and the second trench overlap with at least one of the gate line, the signal line, and the current-supplying line.

19. The display device according to claim 18,
wherein each of the first trench and the second trench extends along at least one of the gate line, the signal line, and the current-supplying line.

20. The display device according to claim 11,
wherein the base material has flexibility.

* * * * *